(12) United States Patent
Sumerel

(10) Patent No.: US 11,364,993 B2
(45) Date of Patent: Jun. 21, 2022

(54) CLOSED-LOOP FEEDBACK CONTROL SYSTEM FOR LANDING GEAR LOAD ALLEVIATION

(71) Applicant: The Boeing Company, Chicago, IL (US)

(72) Inventor: John A. Sumerel, Chicago, IL (US)

(73) Assignee: The Boeing Company, Chicago, IL (US)

( * ) Notice: Subject to any disclaimer, the term of this patent is extended or adjusted under 35 U.S.C. 154(b) by 295 days.

(21) Appl. No.: 16/868,274

(22) Filed: May 6, 2020

(65) Prior Publication Data

US 2021/0347466 A1   Nov. 11, 2021

(51) Int. Cl.

| | | |
|---|---|---|
| *B64C 13/16* | (2006.01) | |
| *G01L 5/16* | (2020.01) | |
| *B64C 25/58* | (2006.01) | |
| *G05D 1/08* | (2006.01) | |
| *B64C 9/00* | (2006.01) | |
| *G01B 7/00* | (2006.01) | |
| *G01B 7/30* | (2006.01) | |
| *G01R 27/02* | (2006.01) | |

(52) U.S. Cl.
CPC ............... *B64C 13/16* (2013.01); *B64C 9/00* (2013.01); *B64C 25/58* (2013.01); *G01B 7/003* (2013.01); *G01B 7/30* (2013.01); *G01L 5/16* (2013.01); *G01R 27/02* (2013.01); *G05D 1/0808* (2013.01); *B64G 2700/24* (2013.01)

(58) Field of Classification Search
CPC ........... B64C 13/16; B64C 9/00; B64C 25/58; B64C 25/02; G01B 7/003; G01B 7/30; G01L 5/16; G01R 27/02; G05D 1/0808; G05D 1/0066; G05D 1/0676; B64G 2700/24; G01P 13/025
See application file for complete search history.

(56) References Cited

U.S. PATENT DOCUMENTS

| | | | |
|---|---|---|---|
| 2010/0078518 A1* | 4/2010 | Tran | ........................ B64C 13/26 701/4 |
| 2014/0067168 A1 | 3/2014 | Tran et al. | |
| 2017/0045409 A1* | 2/2017 | Cousins | ................ G01M 1/125 |

* cited by examiner

*Primary Examiner* — Son T Le
(74) *Attorney, Agent, or Firm* — McDonnell Boehnen Hulbert & Berghoff LLP

(57) ABSTRACT

An example method includes receiving pitch angle sensor information indicative of a pitch angle of a vehicle, wherein the vehicle comprises a main landing gear having a strut and a pitch control surface configured to control the pitch angle of the vehicle; determining a trailing-edge-up limit for upward movement of the pitch control surface to control a de-rotation rate of the vehicle as the vehicle lands; receiving load sensor information indicative of a load on the strut of the main landing gear of the vehicle; based on the pitch angle of the vehicle being below a pitch angle threshold, determining an updated trailing-edge-up limit based on the load on the strut; and controlling the pitch control surface based on the updated trailing-edge-up limit.

20 Claims, 12 Drawing Sheets

CLOSED-LOOP FEEDBACK CONTROL SYSTEM FOR LANDING GEAR LOAD ALLEVIATION

GOVERNMENT LICENSE RIGHTS

This disclosure was made with government support under HR0011-17-9-0001 awarded by Defense Advanced Research Projects Agency. The government has certain rights in the invention.

FIELD

The present invention relates generally to controlling flight control surfaces of a vehicle. Particularly, the present disclosure relates to a vehicle, flight control system, and methods for controlling flight control surfaces to reduce loads on main landing gears of a vehicle during a landing phase of the vehicle.

BACKGROUND

Flight control surfaces of a vehicle, such as an aircraft or space vehicle, are airfoils that deflect air and cause a vehicle to move in a given direction. Flight control surfaces are commanded by pilots or by control laws to move a vehicle about its axes of motion and/or change an orientation of the vehicle.

Flight control surfaces include, for example, ailerons, flaperons, rudders, spoilers, elevators, trim devices, and flaps. The ailerons, spoilers and flaperons can be used to bank or roll a vehicle about the vehicle's longitudinal axis. The rudder causes a vehicle to yaw about a vertical axis. The elevators can move a vehicle about the vehicle's lateral axis to change the vehicle's pitch attitude or pitch angle. Other control surfaces can be used to control pitch angle of the vehicle. For example, a body flap or brake surface may also be used to control the pitch angle.

Typically, a pitch control surface (e.g., elevators or body flap) can move downward, which can be referred to as trailing-edge-down movement, or can move upward, which can be referred to as trailing-edge-up movement. During a landing phase of the vehicle, the vehicle can approach the ground with its nose pitched-up to allow its main landing gear to touch the runway before the nose landing gear. As the vehicle approaches the runway, the vehicle starts to de-rotate or pitch down by gravity and with controlling the pitch control surface (i.e., commanding the elevators trailing-edge-up to maintain a pitch angle). A de-rotation control system of the vehicle can cause the vehicle to gradually pitch down or maintain its pitch angle so that the nose landing gear does not slap down on the ground.

To maintain the pitch angle of the vehicle or reduce its de-rotation rate, the de-rotation control system can move the pitch control surface's trailing edge up. However, moving the pitch control surface's trailing edge up after the main landing gear touch the ground can cause large downward forces to be applied to the struts of the main landing gears and the rear structure of the vehicle.

It may thus be desirable to having a load alleviation controller that can control movement of the pitch control surface to reduce the load on the struts during landing. It is with respect to these and other considerations that the disclosure made herein is presented.

SUMMARY

The present disclosure describes examples that relate to a closed-loop feedback control system for landing gear load alleviation.

In one aspect, the present disclosure describes a method. The method includes: (i) receiving, at a flight control computer of a vehicle, pitch angle sensor information indicative of a pitch angle of the vehicle, wherein the vehicle comprises a main landing gear having a strut and a pitch control surface configured to control the pitch angle of the vehicle; (ii) determining, by the flight control computer, a trailing-edge-up limit for upward movement of the pitch control surface to control a de-rotation rate of the vehicle as the vehicle lands; (iii) receiving, at the flight control computer, load sensor information indicative of a load on the strut of the main landing gear of the vehicle; (iv) based on the pitch angle of the vehicle being below a pitch angle threshold, determining, by the flight control computer, an updated trailing-edge-up limit based on the load on the strut; and (v) controlling, by the flight control computer, the pitch control surface based on the updated trailing-edge-up limit.

In another aspect, the present disclosure describes a non-transitory computer readable medium having stored therein instructions that, in response to execution by a flight control computer of a vehicle, cause the flight control computer to perform operations. The operations include: (i) receiving pitch angle sensor information indicative of a pitch angle of the vehicle, wherein the vehicle comprises a main landing gear having a strut and a pitch control surface configured to control the pitch angle of the vehicle; (ii) determining a trailing-edge-up limit for upward movement of the pitch control surface to control a de-rotation rate of the vehicle as the vehicle lands; (iii) receiving load sensor information indicative of a load on the strut of the main landing gear of the vehicle; (iv) based on the pitch angle of the vehicle being below a pitch angle threshold, determining an updated trailing-edge-up limit based on the load on the strut; and (v) controlling the pitch control surface based on the updated trailing-edge-up limit.

In still another aspect, the present disclosure describes a flight control computer including one or more processors; and data storage storing thereon instructions, that when executed by the one or more processors, cause the flight control computer to perform operations. The operations include: (i) receiving pitch angle sensor information indicative of a pitch angle of the vehicle, wherein the vehicle comprises a main landing gear having a strut and a pitch control surface configured to control the pitch angle of the vehicle; (ii) determining a trailing-edge-up limit for upward movement of the pitch control surface to control a de-rotation rate of the vehicle as the vehicle lands; (iii) receiving load sensor information indicative of a load on the strut of the main landing gear of the vehicle; (iv) based on pitch angle of the vehicle being below a pitch angle threshold, determining an updated trailing-edge-up limit based on the load on the strut; and (v) controlling the pitch control surface based on the updated trailing-edge-up limit.

The foregoing summary is illustrative only and is not intended to be in any way limiting. In addition to the illustrative aspects, examples, and features described above, further aspects, examples, and features will become apparent by reference to the figures and the following detailed description.

BRIEF DESCRIPTION OF THE FIGURES

The novel features believed characteristic of the illustrative examples are set forth in the appended claims. The illustrative examples, however, as well as a preferred mode of use, further objectives and descriptions thereof, will best be understood by reference to the following detailed description of an illustrative example of the present disclosure when read in conjunction with the accompanying Figures.

DETAILED DESCRIPTION

During landing of a vehicle, such as an aircraft, space vehicles, etc., the main landing gear of the vehicle can touch the runway before the nose gear is pitched down to touch the runway. To maintain the pitch angle of the vehicle and control the rate of de-rotation of the vehicle to protect the nose gear against slap-down on the runway, the pitch control surface (e.g., elevators, body flap, etc.) of the vehicle can be commanded to move upward (e.g., trailing-edge-up). Such commanded movement of the pitch control surface, however, can cause a large negative lift on the vehicle. The negative lift can cause a large downward force to be applied to the main landing gears and the rear structure of the vehicle that can substantially exceed the weight of the vehicle and can cause damage.

In an example, an open-loop schedule can be implemented to correlate the pitch angle with the angle or movement of the pitch control surface to attempt to reduce the load on the main landing gear while controlling the pitch angle of the vehicle. However, such open-loop implementation might not take into consideration disturbances or changes in operating conditions (e.g., in the environment of) the vehicle. As such, in some cases, an open-loop control that does not take into consideration the operating conditions of the vehicle might increase the likelihood of lifting the vehicle back off the runway.

Within examples, disclosed herein are a vehicle, systems, and methods for implementing a closed-loop feedback control system that adjusts the deflection of the pitch control surface based on an estimate of the loads on the main landing gear to prevent the loads from exceeding a threshold force. The closed-loop feedback control system can also prevent the loads from going down to zero, which might cause the vehicle to lift off the runway. Such a closed loop feedback control system can be robust and adaptive to environmental uncertainties.

Additionally, the closed-loop control system can detect loads due to crosswind (e.g., wind that has a perpendicular component to the line or direction of travel of the vehicle) by comparing loads on the left and right struts of the respective main landing gears of the vehicle. The control system can responsively command the pitch control surface to compensate for the crosswinds and alleviate the load on the struts with minimal impact to nose gear slap-down rates.

Figure 1:
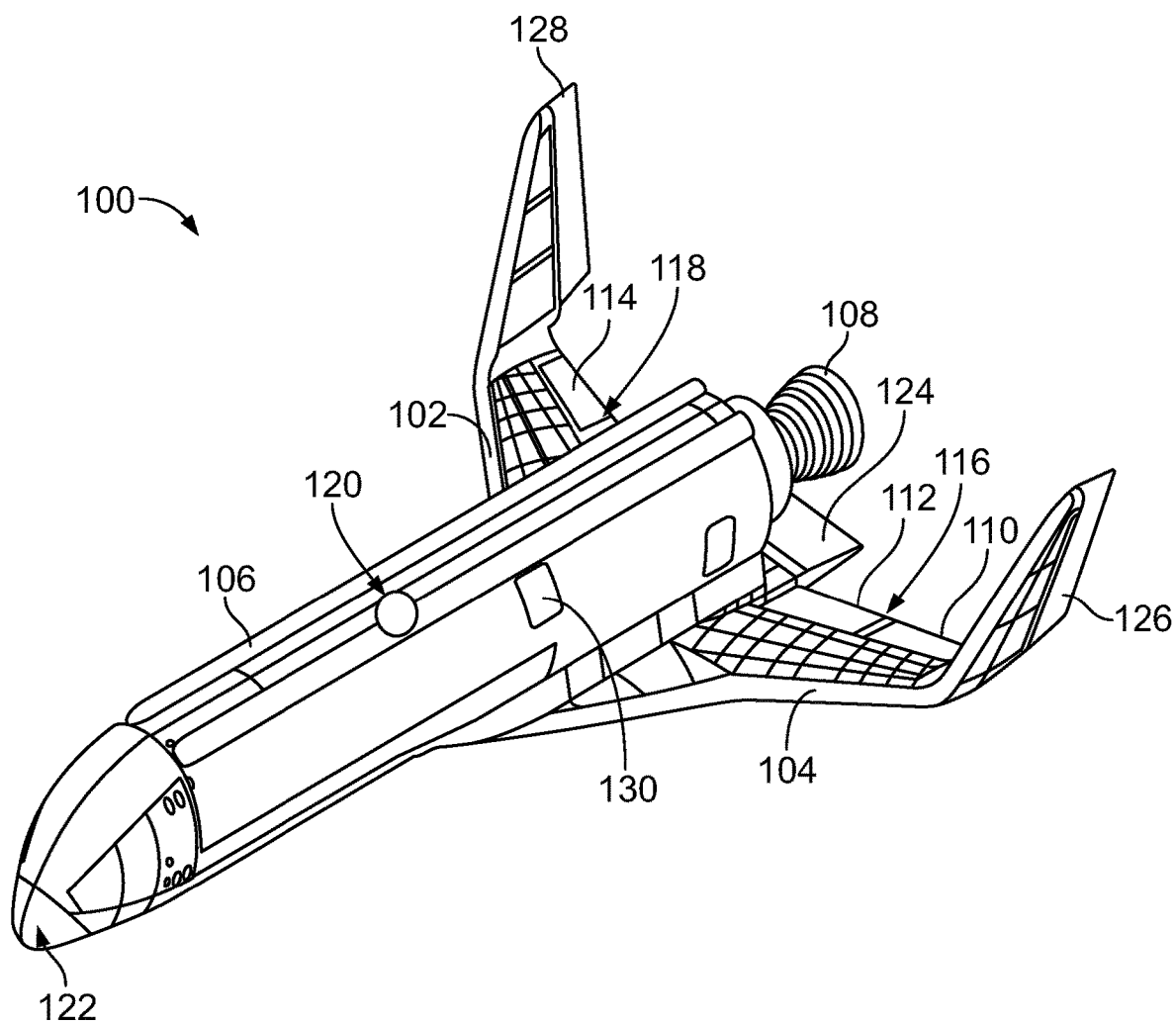
FIG. 1 illustrates a vehicle, in accordance with an example implementation.

FIG. 1 illustrates a vehicle 100, in accordance with an example implementation. The vehicle 100 can have a right wing 102 and a left wing 104 attached to body 106. The vehicle 100 also includes a rear-mounted engine 108.

The vehicle 100 has a number of flight control surfaces. These flight control surfaces include, for example, a left outboard elevator 110, a left inboard elevator 112, a right outboard elevator 114, and a right inboard elevator not visible in FIG. 1. The left outboard elevator 110 and the left inboard elevator 112 can be collectively referred to as left elevator 116, and the right outboard elevator 114 and the right inboard elevator can be collectively referred to as right elevator 118.

The left elevator 116 and the right elevator 118 can operate as elevators to control the pitch angle of the vehicle 100 when they move symmetrically and can also operate as ailerons that control roll of the vehicle 100 when they move asymmetrically. The left elevator 116 and the right elevator 118 are hinged control surfaces attached to a trailing edge of left wing 104 and a trailing edge of the right wing 102, respectively. The left elevator 116 and the right elevator 118 are configured to rotate about their respective hinges up and down by particular angles to control movement of the vehicle 100.

When one elevator goes up (trailing-edge-up), and the other elevator goes down (trailing-edge-down), the vehicle 100 can roll about its longitudinal axis. For example, the left elevator 116 can move downward to increase lift on the left wing 104, while the right elevator 118 can move upward to reduce the lift on the right wing 102, thereby causing the vehicle 100 to roll (in a counter-clockwise direction looking at a nose of the vehicle 100) about a longitudinal axis for vehicle 100.

When the right elevator 118 and the left elevator 116 move symmetrically, they control the pitch angle of the vehicle 100. When the trailing edges of the left elevator 116 and the right elevator 118 move up, the air applies pressure to their surfaces. The pressure causes forces to be applied perpendicular to the surfaces of the right elevator 118 and the left elevator 116. The forces can be resolved into a drag force acting longitudinally and a force acting vertically-downward. The vertically-downward force pushes the rear of the vehicle 100 downward and applies a torque on the vehicle 100 about its center of gravity 120. The torque forces a nose 122 of the vehicle 100 to move upward, i.e., the vehicle 100 pitches upward.

On the other hand, when the trailing edges of right elevator 118 and the left elevator 116 move down, the pressure forces applied perpendicular to the surfaces of the right elevator 118 and the left elevator 116 can be resolved to a drag force acting longitudinally and an upward force acting in an upward direction. The upward force applies a torque on the vehicle 100 about the center of gravity 120 and causes the nose 122 of the vehicle 100 to move downward, i.e., the vehicle 100 pitches downward. As such, in these examples, the right elevator 118 and the left elevator 116 move in a symmetrical fashion such that both elevators move the same amount in the same direction. This type of movement changes the pitch of vehicle 100 upward or downward.

The vehicle 100 can include additional control surfaces such as body flap 124, left rudder 126, right rudder 128, and a brake surface 130 to control other movements of the vehicle 100. For example, the brake surface 130 can be actuated to slow the vehicle 100 down, and the left rudder 126 and the right rudder 128 can control yaw of the vehicle 100.

Further, the body flap 124 and the brake surface 130 may also be used to control pitch angle of the vehicle 100. Particularly, similar to the left elevator 116 and the right elevator 118, the body flap 124 can move downward (e.g., trailing-edge-down) to pitch the vehicle 100 downward, and can move upward (e.g., trailing-edge-up) to pitch the vehicle 100 upward. As such, several control surface of a vehicle can be used to control its pitch angle.

Herein, any surface that can control pitch angle of the vehicle 100 is referred to as a "pitch control surface." As such, the term "pitch control surface" can refer to one or more of the left elevator 116 and the right elevator 118, the body flap 124, or any other surface that can control pitch of the vehicle 100 or any other vehicle.

The illustration of the vehicle 100 in FIG. 1 is an example for illustration and is not meant to imply physical or architectural limitations to the manner in which different implementations disclosed herein may be implemented. For example, in other example implementations, the vehicle 100 may include fewer control surfaces or additional control surfaces. In an example, the vehicle can be a commercial aircraft with wing-mounted engines. In another example, the vehicle can be a cargo aircraft, a military fighter aircraft, a space vehicle capable of landing, etc.

The control surfaces, such as the right elevator 118 and the left elevator 116 can be used to control the vehicle 100 during various phases of flight. For instance, the right elevator 118 and the left elevator 116 can be used to controllably land the vehicle 100 on a runway.

Figure 2:
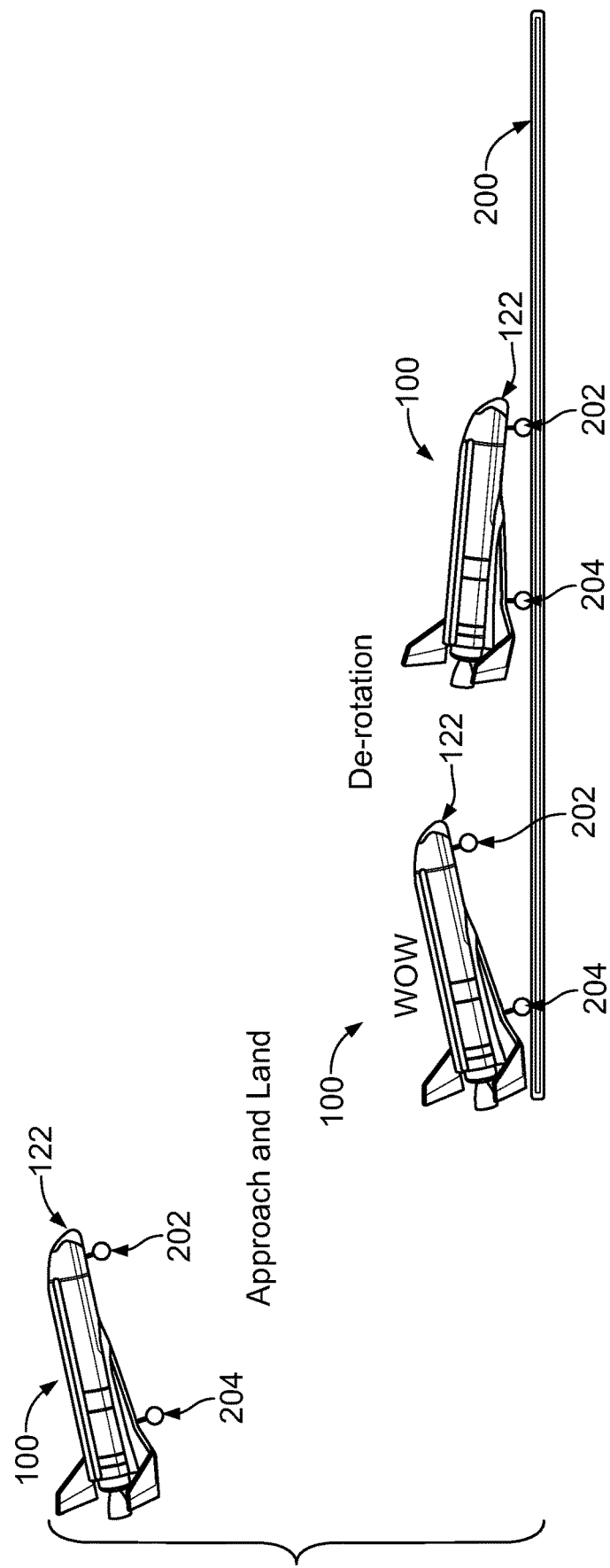
FIG. 2 illustrates stages of landing a vehicle on a runway, in accordance with an example implementation.

FIG. 2 illustrates stages of landing the vehicle 100 on a runway 200, in accordance with an example implementation. As shown in FIG. 2, the vehicle 100 can include a nose landing gear 202 and a main landing gear 204. The main landing gear 204 visible in FIG. 2 can be a right main landing gear, and the vehicle 100 can include a left main landing gear parallel to the right main landing gear and offset laterally therefrom and the vehicle 100 can thus have a tricycle landing gear configuration.

Landing the vehicle 100 can include at least three stages or phases. For example, a first phase of landing the vehicle 100 can include an "approach and land" phase where the right elevator 118 and the left elevator 116 can be controlled as elevators and are commanded to move upward (trailing-edge-up) to pitch the vehicle 100 and the nose 122 upward as shown in FIG. 2. This way, the vehicle 100 is prepared for landing with the main landing gear 204 poised to touch the runway 200 first while the nose 122 remains pitched upward.

A second stage of landing includes the main landing gear 204 touching down the runway 200. As such, the main landing gear 204 is subjected to loads including aerodynamic forces as well as the weight of the vehicle 100. This stage can therefore be referred to as "weight-on-wheel" or WOW as the wheels of the main landing gears are subject to the weight of the vehicle 100. In this second stage, the nose 122 remains pitched-up and has not touched the runway 200. For example, to maintain the nose 122 pitched up, the controller of the vehicle 100 can control the right elevator 118 and the left elevator 116 to move up (trailing-edge-up).

The second stage of landing can be followed by a third stage that can be referred to as de-rotation stage, indicating that the vehicle 100 is rotated to bring the nose 122 down to touch the runway 200 and complete the landing process. De-rotation can be performed in a controlled manner to prevent slap-down (i.e., hard impact) of the nose landing gear 202 with the runway 200 that can damage the nose landing gear 202. While gravity acting downward on the vehicle 100 at the center of gravity 120 helps bring the nose 122 down toward the runway 200, the right elevator 118 and the left elevator 116 can be controlled to have their trailing-edge-up to slow down or control the de-rotation rate, thereby preventing hard impact with the runway 200.

However, as the air applies pressure or aerodynamic forces on the right elevator 118 and the left elevator 116 to help maintain a pitch angle for the nose 122, the downward force component acting on the right elevator 118 and the left elevator 116 can cause a large, static, vertically-downward force to be applied to the main landing gear 204 against the runway 200. The larger the deflection of the right elevator 118 and the left elevator 116 (i.e., the large the angle of upward rotation of the right elevator 118 and the left elevator 116 about their respective hinges), the higher the vertically-downward force.

In some cases, such vertically-downward force can substantially exceed the weight of the vehicle 100, and may cause damage to the main landing gear 204. Therefore, it may be desirable to implement a limit on the extent of deflection of the right elevator 118 and the left elevator 116 to reduce the forces squeezing the main landing gear 204 against the runway 200 and to reduce the likelihood of damage to the main landing gear 204. The description above related to the left elevator 116 and the right elevator 118 being used to control the pitch angle of the vehicle 100 can also be applicable to other pitch control surfaces such as the body flap 124.

Figure 3:
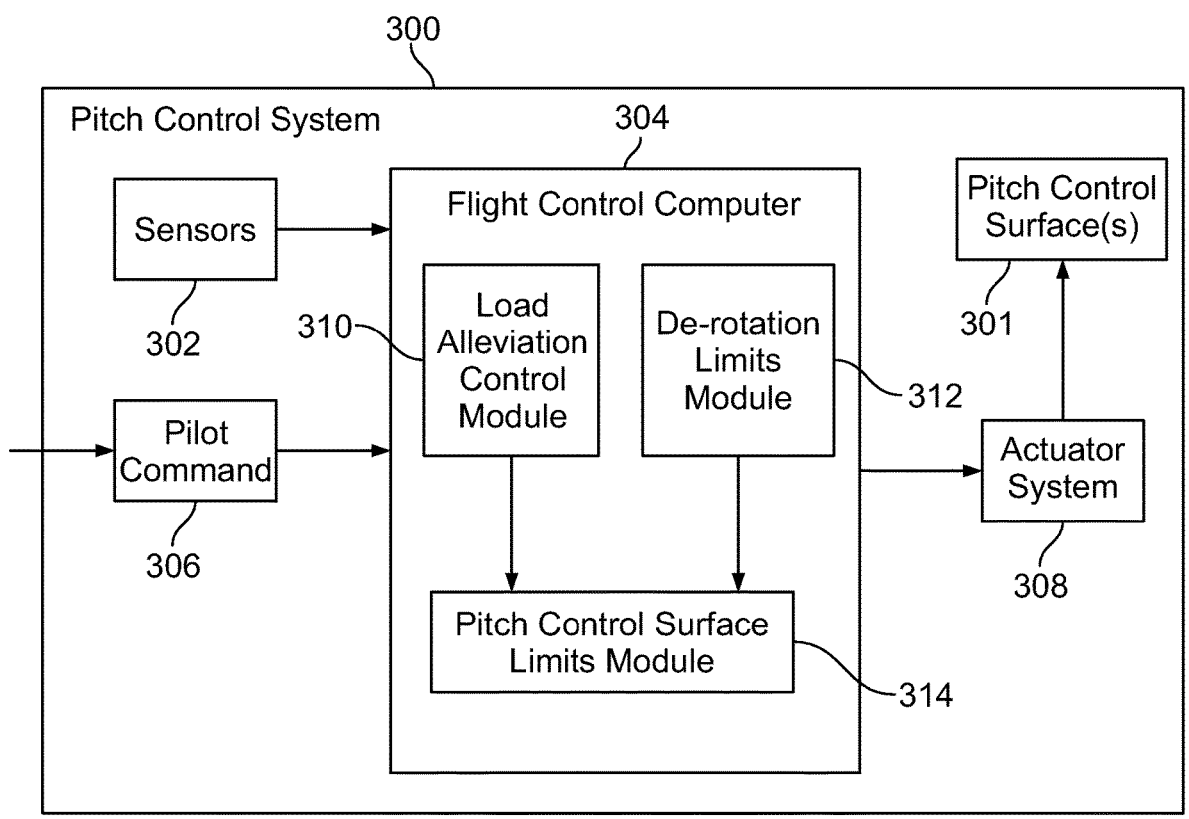
FIG. 3 illustrates a block diagram of a pitch control system, in accordance with an example implementation.

FIG. 3 illustrates a block diagram of a pitch control system 300, in accordance with an example implementation. The pitch control system 300 can be used, for example, to control pitch control surface 301 of the vehicle 100. The pitch control surface 301 can, for example, represent the right elevator 118 and the left elevator 116, the body flap 124, or any other control surface that can be used to control pitch angle of the vehicle 100.

The pitch control system 300 can include one or more sensors 302 coupled to the vehicle 100. The sensors 302 can be configured to provide sensor information indicative of parameters indicating the operating conditions of the vehicle 100. For instance, the sensors 302 can provide load sensor information indicative of a load or force applied to a strut of the main landing gear 204.

Figure 4:
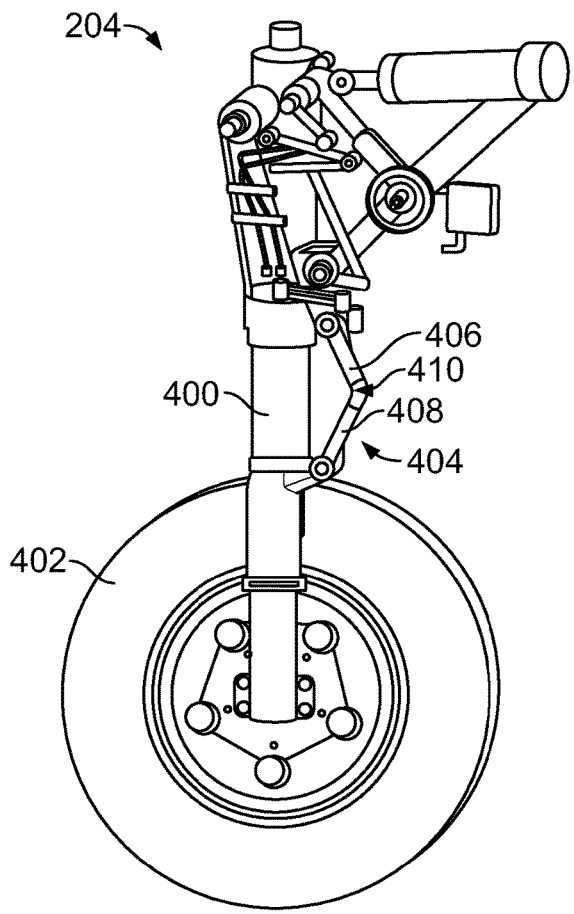
FIG. 4 illustrates a partial view of a main landing gear, in accordance with an example implementation.

FIG. 4 illustrates a partial view of the main landing gear 204, in accordance with an example implementation. The main landing gear 204 can include a strut 400. The strut 400 can include, for example, a piston attached to a wheel axle supporting wheels of the main landing gear 204 such as wheel 402. The piston can be configured to move up and down in a metal tube or cylinder having a cavity in which the piston is slidably accommodated. The cavity within the cylinder can be filled with hydraulic fluid and can be divided into two chambers that communicate through a small orifice. The strut 400 can further include a spring (not shown) that stores impact energy from landing and then releases it.

As such, the strut 400 can operate as a shock absorber configured to cushion the impacts of landing and damps out vertical oscillations of the vehicle 100 upon landing. Upon landing (the main landing gear 204 touching down the runway 200), the strut 400 can compress, and the spring is compressed. The force of the spring thus increases, while the viscosity of the hydraulic fluid dampens the rebound movement as the piston slides up and down, forcing hydraulic fluid through the orifice, which acts as a damper.

The main landing gear 204 can include a torque linkage 404 having a first link 406 hingedly or rotatably coupled to a second link 408 at a joint 410 coupled. As strut 400 moves, the torque linkage 404 also moves and the angle between the first link 406 and the second link 408 at the joint 410 changes. For example, as the strut 400 is compressed, the first link 406 and the second link 408 move closer to each other and the angle therebetween decreases, and vice versa.

When the main landing gear 204 initially touches down the runway 200, the force acting on the strut 400 as the piston of the strut 400 moves up and down can comprise a dampening force and a spring force. The dampening force can be determined by multiplying a dampening factor by the speed of the piston and the spring force can be determined by multiplying a spring rate of the spring by the compression or deflection of the spring. Subsequently, the piston may stop moving up and down as the oscillations subside, and the force acting on the strut 400 is largely the spring force. The force acting on the strut 400 can thus be estimated by determining the extent of axial compression of the spring, then multiplying the axial compression by the spring constant.

One or more sensors of the sensors 302 can be coupled to the strut 400 to provide load sensor information indicative of the extent of axial compression of the spring. For example, the sensors 302 can include a linear variable differential transformer (LVDT), which is a type of electrical transformer used for measuring linear displacement, coupled to the piston to measure the axial displacement of the piston, which corresponds to or correlates with the compression of the spring.

In another example, a rotary variable differential transformer (RVDT), which is a type of electrical transformer used for measuring angular displacement, or other angle sensors can be coupled to the joint 410. As the first link 406 and the second link 408 move relative to each other, the RVDT can provide angle sensor information indicative of a measurement of the angle therebetween, which is kinematically or geometrically correlated with the linear displacement of the piston and the compression of the spring. Other types of sensor can be used to estimate the load that the strut 400 is subjected to including accelerometers, encoders, strain gauges, potentiometers, load cells, eddy current sensors, altimeters, that can provide information correlated with the load on the strut 400.

The sensors 302 can include other sensors indicative of other operating conditions of the vehicle 100. For instance, the sensors 302 can include a pitch angle sensor configured to provide pitch angle sensor information indicative of a pitch angle of the vehicle 100, a roll angle sensor configured to provide roll angle sensor information indicative of a roll angle of the vehicle 100, a speed sensor configured to provide information indicative of a ground speed of the vehicle 100, etc.

Referring back to FIG. 3, the pitch control system 300 can include a flight control computer 304 configured to receive the sensor information from the sensors 302. The flight control computer 304 can include computing devices, processors, data storage, memories, etc., and can be in communication with various systems and subsystems of the vehicle 100. For instance, the flight control computer 304 can be in communication with the sensors 302, navigation module, trajectory management module, communication devices, guidance module, etc. of the vehicle 100. For example, the flight control computer 304 can be configured to receive load sensor information from the sensors 302 indicative of load on the strut 400 in addition to pilot command 306 and responsively issue commands that move the flight control surfaces (e.g., the pitch control surface 301) of the vehicle 100 to achieve a desired movement for the vehicle 100.

Particularly, the pitch control system 300 can include an actuator system 308 configured to move the flight control surfaces of the vehicle 100 such as the pitch control surface 301 (e.g., the left elevator 116 and the right elevator 118). The actuator system 308 can include a number of actuators (e.g., hydraulic cylinder actuators or electromechanical actuators) coupled to the flight control surfaces and configured to move them as commanded by the flight control computer 304 to control the orientation or movement of the vehicle 100. The actuator system 308 can work in conjunction with various hydraulic, mechanical, and/or other biasing mechanisms to move the flight control surfaces including the pitch control surface 301.

The flight control computer 304 can include several control modules such as load alleviation control module 310, a de-rotation limits module 312, and a pitch control surface limits module 314. Such control modules are examples of software components that may be implemented in the flight control computer 304 to control the movement of the pitch control surface 301.

The de-rotation limits module 312 is configured to issue commands for, or limits on the extent of movement of, the pitch control surface 301 to achieve landing in a controlled manner. For example, the de-rotation limits module 312 can determine limits for the movement of the pitch control surface 301 so as to gradually decrease the pitch angle of the vehicle 100 after the main landing gear 204 touches down until the nose landing gear 202 touches down without a hard slap-down that can damage the nose landing gear 202.

Figure 5:
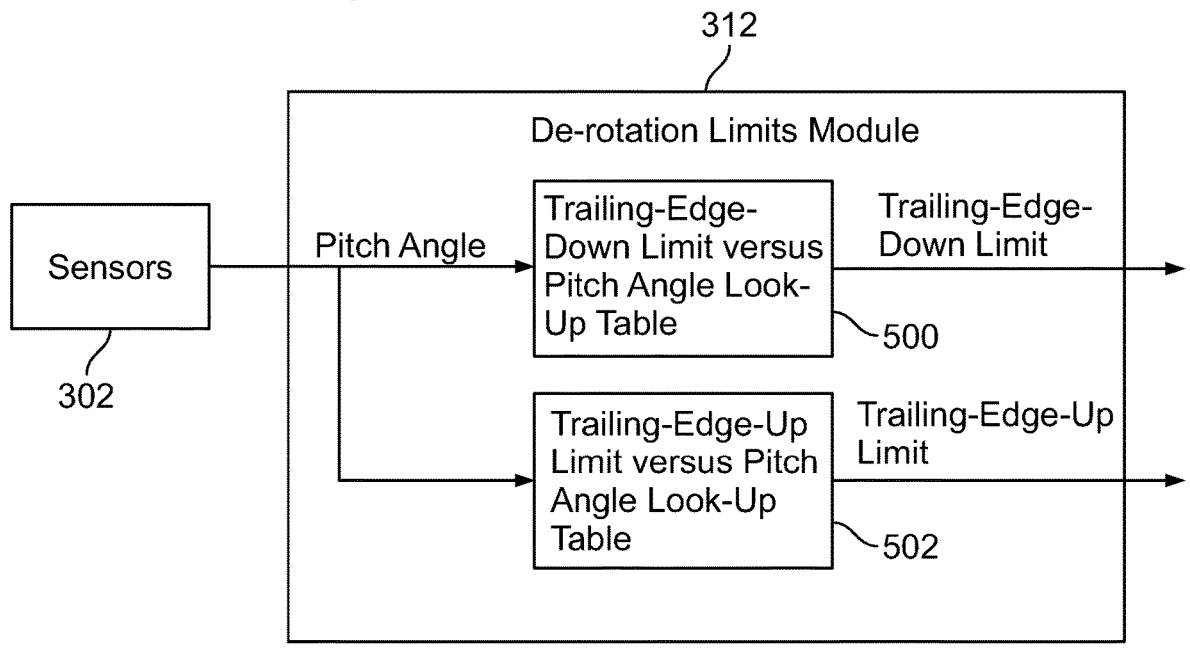
FIG. 5 illustrates a block diagram of a de-rotation limits module, in accordance with an example implementation.

FIG. 5 illustrates a block diagram of the de-rotation limits module 312, in accordance with an example implementation. The de-rotation limits module 312 can be configured to receive, from the sensors 302, information indicative of the pitch angle of the vehicle 100. The de-rotation limits module 312 can then determine trailing-edge-up limits and trailing-edge-down limits for the pitch control surface 301.

For example, the de-rotation limits module 312 can include a look-up table 500 that can receive the information indicative of the pitch angle of the vehicle 100 provided by the sensors 302 and then determines corresponding trailing-edge-down limits for the pitch control surface 301. Similarly, the de-rotation limits module 312 can include a look-up table 502 that can receive the information indicative of the pitch angle of the vehicle 100 and then determines corresponding trailing-edge-up limits for the pitch control surface 301.

As such, the de-rotation limits module 312 can generate limits on the extent of motion of the pitch control surface 301 to achieve landing in a controlled manner. As mentioned above, however, allowing the pitch control surface 301 to move up (trailing-edge-up) to maintain or control the pitch angle of the vehicle 100 and slowly de-rotating the vehicle 100 can cause large aerodynamic forces to be applied to the main landing gear 204. To avoid the aerodynamic forces acting on the main landing gear 204 from exceeding a threshold force, the load alleviation control module 310 can operate to reduce the limits on the allowable extent of trailing-edge-up motion of the pitch control surface 301 so as to reduce the forces on the main landing gear 204.

The limits generated by the load alleviation control module 310 can include, for example, a maximum movement or position of the pitch control surface 301 in a given direction. For example, the maximum limit may be the highest upward position of the pitch control surface 301 (i.e., highest trailing-edge-up or maximum angle of deflection allowed for the pitch control surface 301). Similarly, the limits generated by the load alleviation control module 310 can include, for example, a minimum movement or position of the pitch control surface 301.

The pitch control surface limits module 314 can, for example, receive limits from both the load alleviation control module 310 and the de-rotation limits module 312 and determine or resolve which limits to use. For example, as described below, the pitch control surface limits module 314 can determine when to use the limits provided by the load alleviation control module 310 based on pitch angle of the vehicle 100.

In an example, the load alleviation control module 310 is configured to detect or estimate the load acting on the strut 400 of the main landing gear 204 and compare the load to a target or desired load that is not to be exceeded. The comparison can generate an error or a discrepancy that can then be provided to a closed-loop feedback controller that sets the limits on the pitch control surface 301 so as to reduce or eliminate the error.

Figure 6:
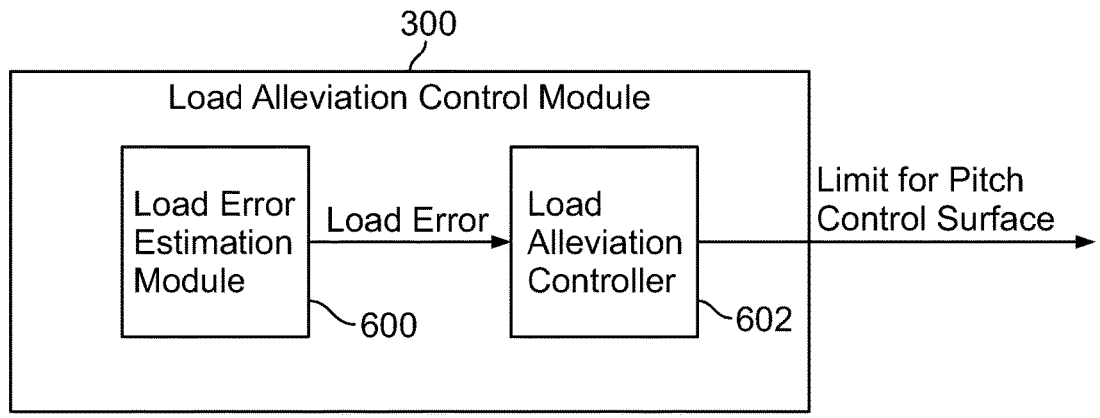
FIG. 6 illustrates a block diagram of a load alleviation control module, in accordance with an example implementation.

FIG. 6 illustrates a block diagram of the load alleviation control module 310, in accordance with an example implementation. The load alleviation control module 310 can include a load error estimation module 600 and a load alleviation controller 602.

Figure 7:
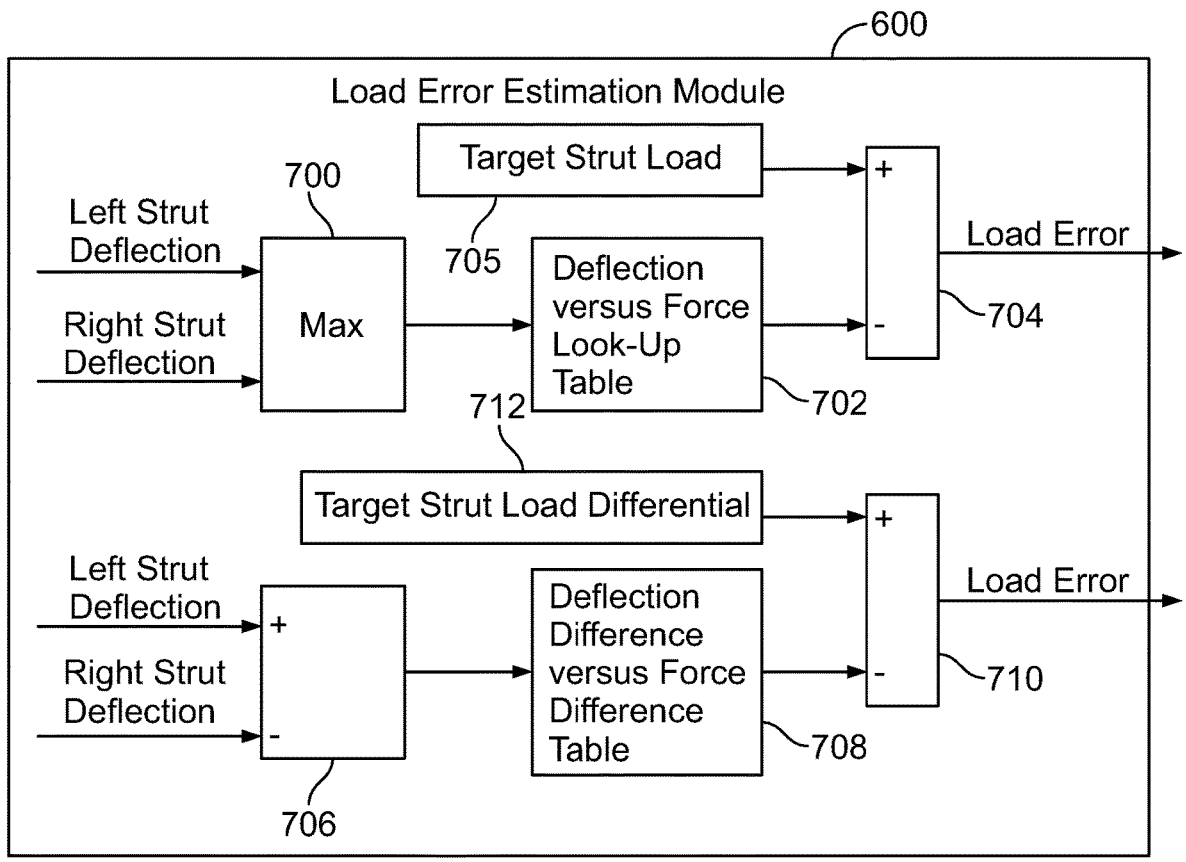
FIG. 7 illustrates a block diagram of a load error estimation module, in accordance with an example implementation.

FIG. 7 illustrates a block diagram of the load error estimation module 600, in accordance with an example implementation. In an example, the flight control computer 304 can receive the load sensor information from the sensors 302 and determine the left strut force and the right strut force as described above with respect to FIG. 4 and then provide the determined forces to the load error estimation module 600. In another example, the load error estimation module 600 can determine the left strut force and the right strut forces based on the sensor information.

For instance, the load error estimation module 600 can receive sensor information from the sensors 302 indicative of respective deflection of the left strut (e.g., stroke of the piston or angular rotation at the joint 410 of the torque linkage 404). The load error estimation module 600 can also receive sensor information from the sensors 302 indicative of respective deflection of the right strut, i.e., the strut 400 of the main landing gear 204. The load error estimation module 600 can then determine which deflection is larger at maximum block 700 ("Max block"), and thus determine the higher of the loads that the two main landing gears are subjected to. By determining the higher force and reducing it, the flight control computer 304 can address the higher risk and reduce forces on both struts.

The load error estimation module 600 can include a look-up table 702 that can receive the deflection or stroke provided by the maximum block 700 and determines the corresponding force acting on the strut (e.g., on the strut 400). At difference block 704, the load error estimation module 600 can compare the estimated force acting on the strut to a desired or target strut load 705. The target strut load 705 can be a limit force where it might not be desirable to exceed it so as to preclude damage to the struts.

The difference between the actual maximum force acting on one of the struts and the target strut load 705 is an error or discrepancy that is fed to the load alleviation controller 602. The load alleviation controller 602 can be configured as a closed-loop feedback controller as described below configured to limit the trailing-edge-up movement of the pitch control surface 301 to reduce the load error, thereby reducing the forces acting on the struts or preclude the forces from exceeding the target strut load 705. In the case that the pitch control surface 301 comprises the left elevator 116 and the right elevator 118, the elevators are controlled as elevators that are commanded symmetrically.

The trailing-edge-down movement of the pitch control surface 301 might not increase the loads on the struts. Therefore, it might be sufficient to limit the trailing-edge-up movement, while allowing the limit on the trailing-edge-down movement to be set by the de-rotation limits module 312.

In addition or alternative to estimating forces acting on the individual struts, the load error estimation module 600 can also be configured to estimate the difference between the left strut force. Such difference can be indicative of the crosswind forces acting on the vehicle 100.

As the vehicle 100 lands, it might be subjected to crosswinds, i.e., wind blowing across or laterally, which can cause the vehicle 100 to roll and load a strut of one main landing gear more than the other. The sensors 302 can include a sensor configured to detect or measure the roll angle of the vehicle 100. However, if the roll angle sensor detects a roll angle greater than zero after the vehicle 100 has landed, the controller of the vehicle 100 might not be able to determine based on the sensor information whether the roll angle is because of crosswinds or because of runway crown (e.g., curvature in the runway 200 that facilitates water drainage).

As such, attempting to reduce the roll angle to make it close to zero based on the roll angle sensor measurement might not be effective as the controller might be trying to compensate for the runway crown. Further, in some cases the roll angle due to crosswinds may be sufficiently small that the roll angle sensor might not be able to measure (e.g., the roll angle is within the margin of error of the roll angle sensor).

Thus, measuring a force differential between the left and right struts can be an enhanced indicator of crosswinds than measurement of the roll angle. If there is a difference between the forces, then crosswinds are the likely cause of such difference. The flight control computer 304 can then control the pitch control surfaces comprising the left elevator 116 and the right elevator 118 as ailerons (asymmetrically), e.g., limit the extent of their movement, to control roll and compensate for the crosswinds.

For instance, the load error estimation module 600 can receive sensor information from the sensors 302 indicative of deflection of the left strut and the right strut as described above, and then determine the difference between the deflections at difference block 706. By determining the difference and attempting to reduce it, the flight control computer 304 can compensate for and counter the crosswinds.

The load error estimation module 600 can include a look-up table 708 that can receive the difference in deflection or stroke provided by the difference block 706 and then determines the corresponding force differential (i.e., difference between forces acting on the struts). At difference block 710, the load error estimation module 600 can compare the estimated force differential to a desired or target strut load differential 712. Reducing the difference between the estimated force differential to the target strut load differential can compensate for crosswinds effect on the vehicle 100.

The difference between the estimated force differential and the target strut load differential 712 is a load differential error or discrepancy that can be fed to the load alleviation controller 602. The load alleviation controller 602 can then implement a closed-loop feedback control system to limit the trailing-edge-up and trailing-edge-down movement of the left elevator 116 and the right elevator 118 to reduce the load differential error, thereby compensating for or countering the crosswind. In this case, the pitch control surfaces comprising the left elevator 116 and the right elevator 118 are controlled as ailerons that can be commanded asymmetrically.

In the description below, the load alleviation controller 602 is described with respect to the case where the pitch control surface(s) are controlled symmetrically as elevators to reduce the maximum force on the struts. However, it should be understood that a similar closed-loop feedback control system can be implemented by the load alleviation controller 602 to control the pitch control surfaces(s) (e.g., the left elevator 116 and the right elevator 118) asymmetrically as ailerons to counter the effect of crosswind.

Referring back to FIG. 6, the load error generated or determined by the load error estimation module 600 is fed as an input to the load alleviation controller 602. The load alleviation controller 602 is configured to implement a closed-loop feedback control system to reduce the load error, thereby reducing the magnitude of the forces acting on the struts. In the description below, the load alleviation controller 602 is configured as a proportional-integral (PI) closed-loop feedback controller as an example for illustration. However, other configurations such as proportional-integral-differential (PID), bang-bang, etc. could be used as well.

Figure 8:
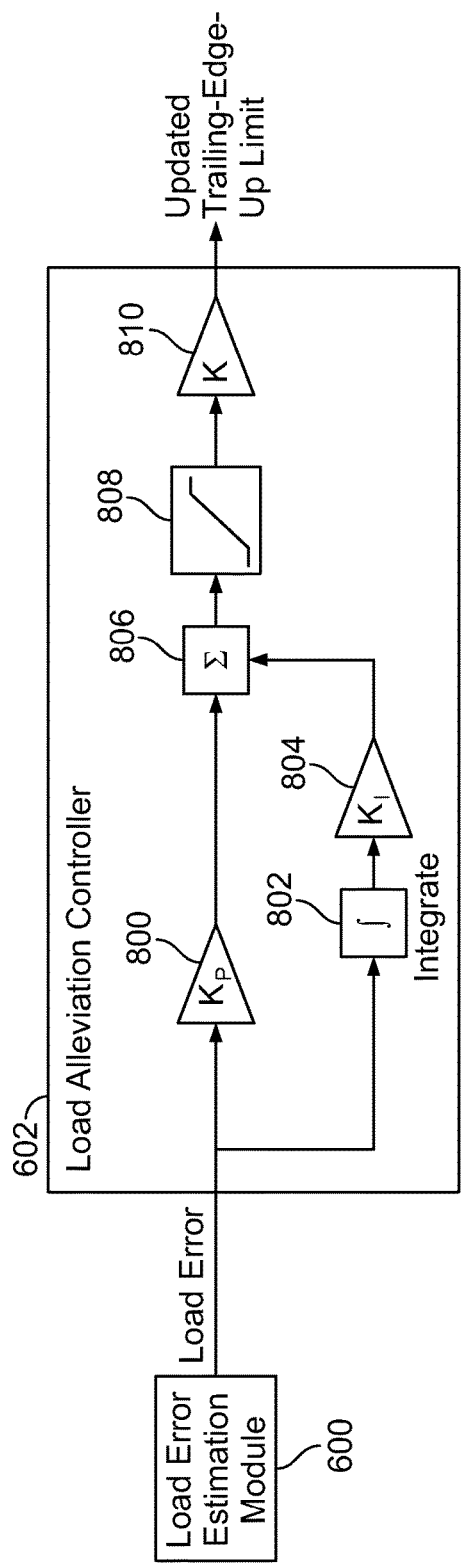
FIG. 8 illustrates a block diagram of a load alleviation controller, in accordance with an example implementation.

FIG. 8 illustrates a block diagram of the load alleviation controller 602, in accordance with an example implementation. The load error determined or generated by the load error estimation module 600 is provided to the load alleviation controller 602. The load alleviation controller 602 multiplies the load error by a proportional gain $K_P$ at block 800. The load error is also integrated at block 802. The result of the integration at the block 802 is then multiplied by an integral gain $K_I$ at block 804.

The output of the block 804 is then summed with the output of the block 800 at summation block 806 to generate an updated trailing-edge-up limit for the pitch control surface 301. The trailing-edge-up limit generated by the load alleviation controller 602 is referred to as an "updated" limit as it might be different than, and may override under particular conditions, the respective trailing-edge-up limit generated by the de-rotation limits module 312.

In examples, the load alleviation controller 602 can include a rate limiter block 808 configured to limit or control the rate of change of the updated trailing-edge-up limit to be less than a threshold rate of change that is within capability of the actuator system 308. For instance, if the load error is a large value, the result of the summation block 806 can also be a large value. To make smooth changes to the updated trailing-edge-up limit, the rate limiter block 808 can gradually change the updated trailing-edge-up limit to prevent sudden, jerky vehicle movement or movements that are not within the capability of the actuator system 308.

In examples, the load alleviation controller 602 can include anti-windup operations. In some cases, the output of the summation block 806 reaches the saturation limits of the rate limiter block 808. In this case, the block 802 can keep integrating and accumulating the load error and its output can keep increasing. When the load error decreases, the large integral value may cause a response of the load alleviation controller 602 to be delayed. As such, the load alleviation controller 602 can have anti-windup measures such as stopping integration of the load error at the block 802 if saturation at the rate limiter block 808 occurs.

In an example, the load alleviation controller 602 can include a block 810 configured to multiply a scalar value or gain with the output of the rate limiter block 808. The scalar value can be used for unit conversion or scaling, for example. For instance, the output of the rate limiter block 808 can be in degrees per second indicating a limit for the rate of rotation of the pitch control surface 301 about its hinge as it moves upward (i.e., trailing-edge-up). The block 810 can then convert the output of the rate limiter block 808 to a delta degree value or change in the angle of the pitch control surface 301 in degrees, rather than a rate in degrees per second.

With the configuration of FIG. 8, the load alleviation controller 602 generates an updated trailing-edge-up limit that can be different from the trailing-edge-up limit generated by the de-rotation limits module 312 as described above with respect to FIG. 5. The updated trailing-edge-up limit for the pitch control surface 301 can prevent the load on the struts (e.g., the strut 400) of the main landing gear 204 from exceeding a threshold strut force (e.g., the target strut load 705).

Under particular operating conditions, as described below, the updated trailing-edge-up limit generated by the load alleviation control module 310 can override the trailing-edge-up limit generated by the de-rotation limits module 312. The flight control computer 304 can limit the movement of the pitch control surface 301 accordingly to reduce the load, on and deflection of, the struts. The deflection is fed back continually to the load alleviation control module 310 to adjust the updated trailing-edge-up limit in a closed-loop feedback configuration that can compensate for environmental disturbances or uncertainties in the operating conditions of the vehicle 100.

Referring back to FIG. 3, the pitch control surface limits module 314 is configured to receive the pitch control surface limits generated by the de-rotation limits module 312 and the updated trailing-edge-up limit generated by the load alleviation control module 310. The pitch control surface limits module 314 can then resolve which limits to use based on operating conditions or status of the vehicle 100 as indicated by the sensors 302.

Figure 9:
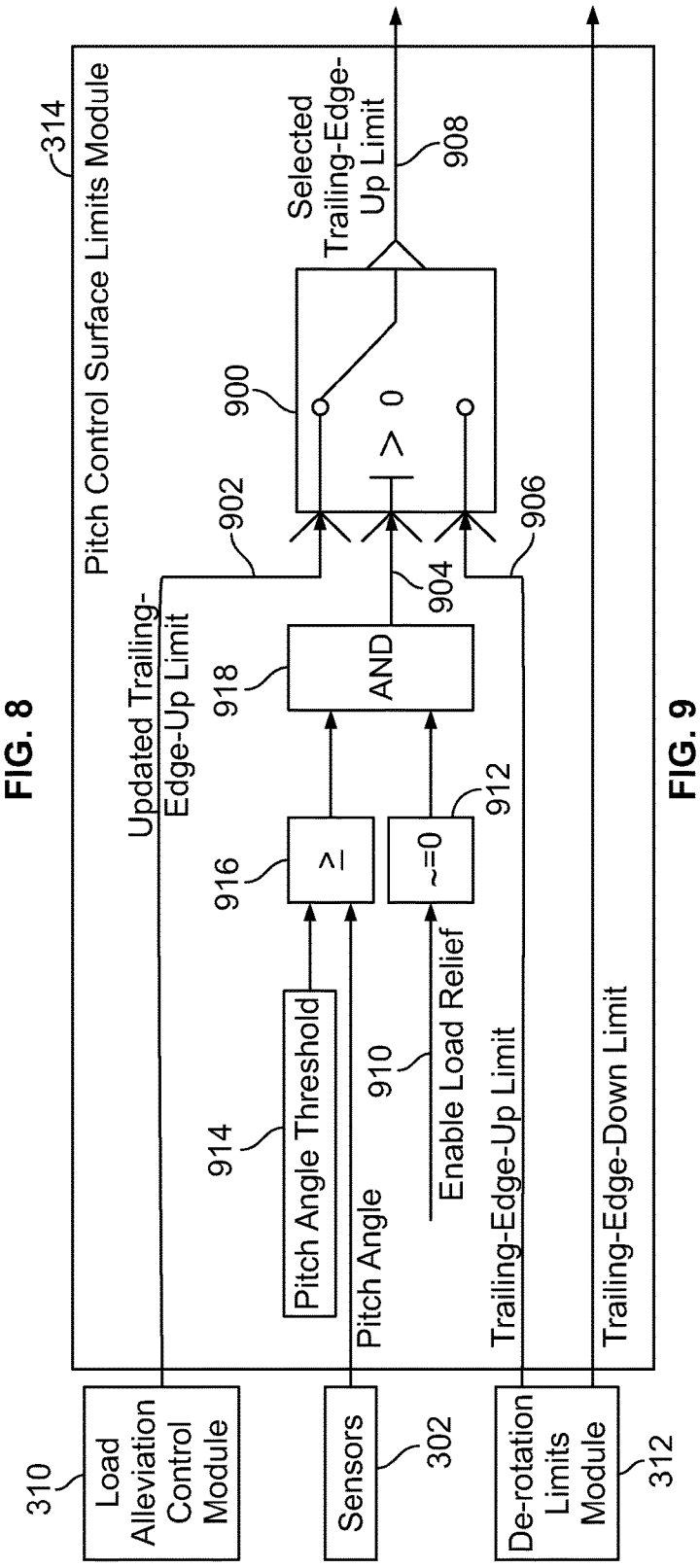
FIG. 9 illustrates a block diagram of a pitch control surface limits module, in accordance with an example implementation.

FIG. 9 illustrates a block diagram of the pitch control surface limits module 314, in accordance with an example implementation. As depicted in FIG. 9, the pitch control surface limits module 314 can receive an input from the sensors 302 indicating the pitch angle of the vehicle 100. The pitch control surface limits module 314 also receives the trailing-edge-up and trailing-edge-down limits from the de-rotation limits module 312 as well as the updated trailing-edge-up limit from the load alleviation control module 310 for the pitch control surface 301.

The pitch control surface limits module 314 can be configured to pass through the trailing-edge-down limit determined by the de-rotation limits modules 312 as the trailing-edge-down movement does not increase the downward force on the main landing gear 204. However, the pitch control surface limits module 314 is configured to select whether to use the trailing-edge-up limit provided by the de-rotation limits module 312 or the updated trailing-edge-up limit provided by the load alleviation control module 310 based on one or more criteria.

As an example implementation, the pitch control surface limits module 314 can have a switch block 900 configured to receive a first input signal 902, a second input signal 904, and a third input signal 906, and provide an output signal 908. Particularly, the switch block 900 is configured to pass through the first input signal 902 or the third input signal 906 as the output signal 908 based on the value of the second input signal 904. As such, the first input signal 902 and the third input signal 906 are data input, whereas the second input signal 904 is a control input signal.

For instance, the updated trailing-edge-up limit can be the first input signal 902 and the trailing-edge-up limit provided by the de-rotation limits module 312 can be the third input signal 906, and the switch block 900 can then determine whether to pass the first input signal 902 based on whether the second input signal 904 meets a threshold value. As an example, if the second input signal 904 has a value greater than zero, then the switch block 900 passes the first input signal 902 from the load alleviation control module 310 as the output signal 908. If the second input signal 904 has a value of zero, then the switch block 900 passes the third input signal 906 from the de-rotation limits module 312 as the output signal 908.

In examples, the flight control computer 304 can provide an enable load relief signal 910 to the pitch control surface limits module 314 to indicate whether to enabling using the updated trailing-edge-up limit or not. At block 912, the pitch control surface limits module 314 determines whether the enable load relief signal 910 meets an enable load relief threshold or enablement criterion. For instance, if the value of the enable load relief signal 910 is 1 or other non-zero value, then the block 912 produces a value of 1. If the value of the enable load relief signal 910 is zero, then the block 912 produces a value of 0.

Further, rather than the load alleviation control module 310 being continually activated or enabled (i.e., continually affecting the control of the pitch control surface 301), the load alleviation control module 310 can be activated when the pitch angle of the vehicle 100 is below a particular threshold pitch angle. As such, the pitch control surface limits module 314 can have access to or receive a pitch angle threshold 914, and the pitch control surface limits module 314 can compare the pitch angle received from the sensors 302 to the pitch angle threshold 914 at block 916.

If the pitch angle is larger than the pitch angle threshold 914, the block 916 produces a value of zero. If the pitch angle is less than the pitch angle threshold 914, the block 916 produces a value of 1. For example, the pitch angle threshold 914 can be set to a value between 4 and 5 degrees, e.g., 4.5 degrees. The value of the pitch angle threshold 914 can, for example, correspond to a state of de-rotation after the initial touch down of the main landing gear 204 of the vehicle 100. This way, the load alleviation control module 310 might not affect the vehicle 100 until after initial touch down on the runway 200.

Once the pitch angle of the vehicle 100 gets below the pitch angle threshold 914 (e.g., 4.5 degrees), the block 916 produces a value of 1 to enable using the updated trailing-edge-up limit from the load alleviation control module 310. Particularly, the pitch control surface limits module 314 can have an AND block 918 that can generate a value of 1 at its output if both its inputs are ones. If one of the inputs is not 1, the AND block 918 generates a value of zero. With this configuration, if either the enable load relief signal 910 is "off" (i.e., has a zero value) or the pitch angle is greater than the pitch angle threshold 914, the AND block 918 generates a value of zero that is received as the second input signal 904 at the switch block 900. Responsively, the switch block 900 passes the third input signal 906 as the output signal 908, and thus the pitch control surface limits module 314 selects the trailing-edge-up limit received from the de-rotation limits module 312.

On the other hand, if the enable load relief signal 910 is "on" (i.e., has a non-zero value) and the pitch angle is less than the pitch angle threshold 914, the AND block 918 generates a value of 1 that is received as the second input signal 904 at the switch block 900. Responsively, the switch block 900 passes the first input signal 902 received from the load alleviation control module 310, and thus the pitch control surface limits module 314 selects the updated trailing-edge-up limit received from the load alleviation control module 310. In this case, the updated trailing-edge-up limit of the load alleviation control module 310 overrides the trailing-edge-up limit of the de-rotation limits module 312 so as to reduce the forces acting on the struts (e.g., the strut 400).

The logic depicted in FIG. 9 is an example for illustration and other configurations can be used. Particularly, other conditional logic that allows the updated trailing-edge-up to pass through when both the enable load relief signal 910 is active and the pitch angle of the vehicle 100 is less than the pitch angle threshold 914 can be used.

In an example, the pitch control surface limits module 314 can be configured to allow the updated trailing-edge-up limit of the load alleviation control module 310 to override the trailing-edge-up limit of the de-rotation limits module 312 if a magnitude of the updated trailing-edge-up limit is less than a respective magnitude of the trailing-edge-up limit of the de-rotation limits module 312, and therefore further limits the allowable trailing-edge-up movement. Otherwise, the pitch control surface limits module 314 can select the trailing-edge-up limit received from the de-rotation limits module 312.

Implementing the control strategy described above where determining and varying the trailing-edge-up limit of the pitch control surface 301 is based on the load on the struts (e.g., the downward force acting on the strut 400) can preclude the load from exceeding a safe threshold load. As mentioned above with respect to FIG. 7, in addition or alternative to using load error based on the individual struts as an input to the load alleviation controller 602, the load differential indicating crosswinds can be used to limit the trailing-edge-up and trailing-edge-down limits of pitch control surfaces, e.g., the left elevator 116 and right elevator 118, to counter the crosswinds. For example, the flight control computer can determine a respective updated trailing-edge-up limit for the left elevator 116 and a respective updated trailing-edge-up limit for the right elevator 118, and these limits may be different as the left elevator 116 and the right elevator 118 can be controlled asymmetrically when controlling roll of the vehicle 100.

Further, the control strategy can accomplish strut load control without affecting the stopping distance or time of the vehicle 100 after touching down on the runway 200.

Figure 10:
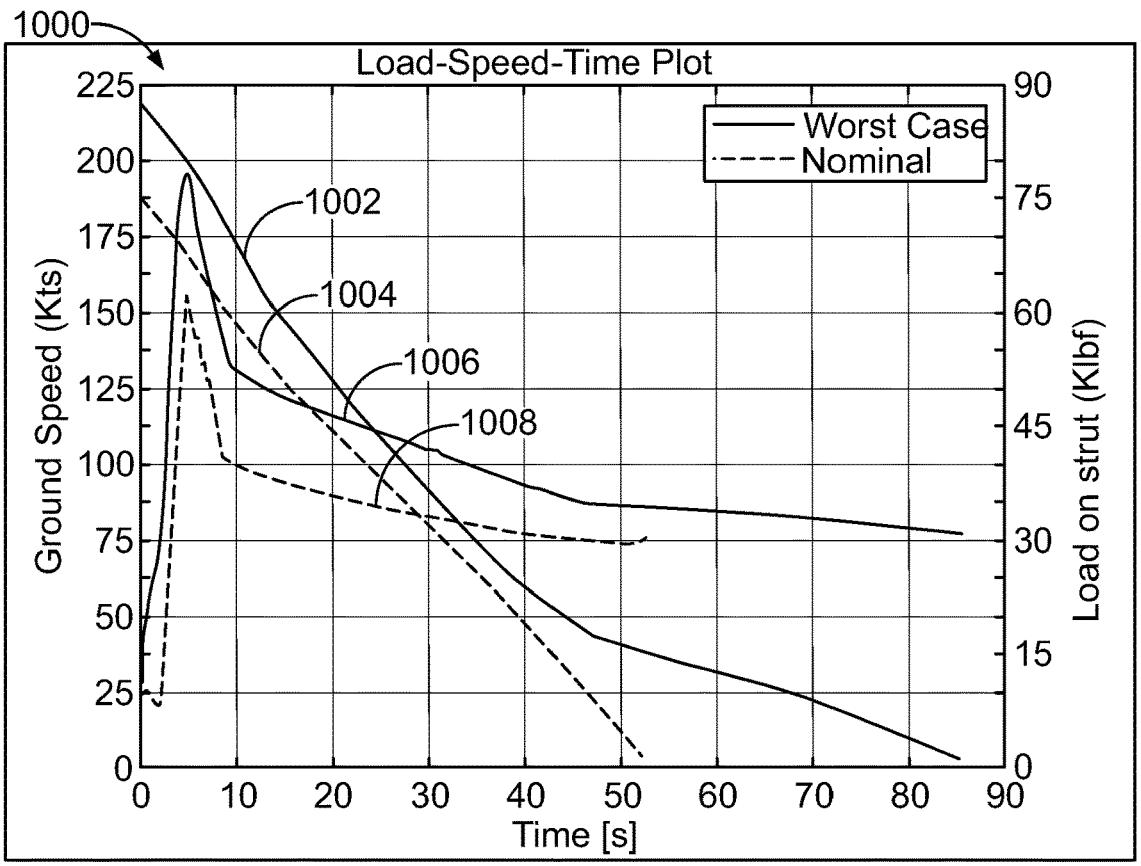
FIG. 10 illustrates a graph of simulation results showing loads on a strut of a main landing gear without updating a trailing-edge-up limit of a pitch control surface based on the load on the strut, in accordance with an example implementation.

FIG. 10 illustrates a graph 1000 of simulation results showing loads on the strut 400 of the main landing gear 204 without updating the trailing-edge-up limit of the pitch control surface 301 based on the load on the strut 400. In other words, the simulation results in FIG. 10 can be obtained, for example, by setting the enable load relief signal 910 to zero.

The x-axis of the graph 1000 depicts time in seconds (s), the left y-axis depicts ground speed of the vehicle 100 in knots (kts), and the right y-axis depicts load on the strut 400 in kilo pound-force (klbs). Line 1002 represents variation in ground speed over time under a worst case scenario of operating conditions of the vehicle 100 (e.g., under uncertain conditions, aerodynamic disturbances, etc.). Line 1004 represents variation in ground speed over time under nominal operating conditions. Line 1006 represents variation in the load on the strut 400 over time under a worst case scenario of operating conditions of the vehicle 100, and line 1008 represents variation in the load over time under nominal operating conditions.

The vehicle 100 can land at about time equal zero seconds and then a spike in the load on the strut 400 occurs. Under worst case scenario, line 1006 shows the force reaching about 80 klbs, and under nominal conditions, line 1008 shows the force reaching about 62 klbs. These forces represent aerodynamic forces due to the trailing-edge-up movement of the pitch control surface 301 in addition to the weight of the vehicle 100. The force is then reduced over time until the force is equal to the weight of the vehicle 100 (e.g., about 30 klbs).

Upon landing, the ground speed of the vehicle 100 is about 220 kts under worst case scenario and about 188 kts under nominal conditions. The vehicle 100 stops in about 85 seconds under worst case scenario and in about 53 seconds under nominal conditions.

Figure 11:
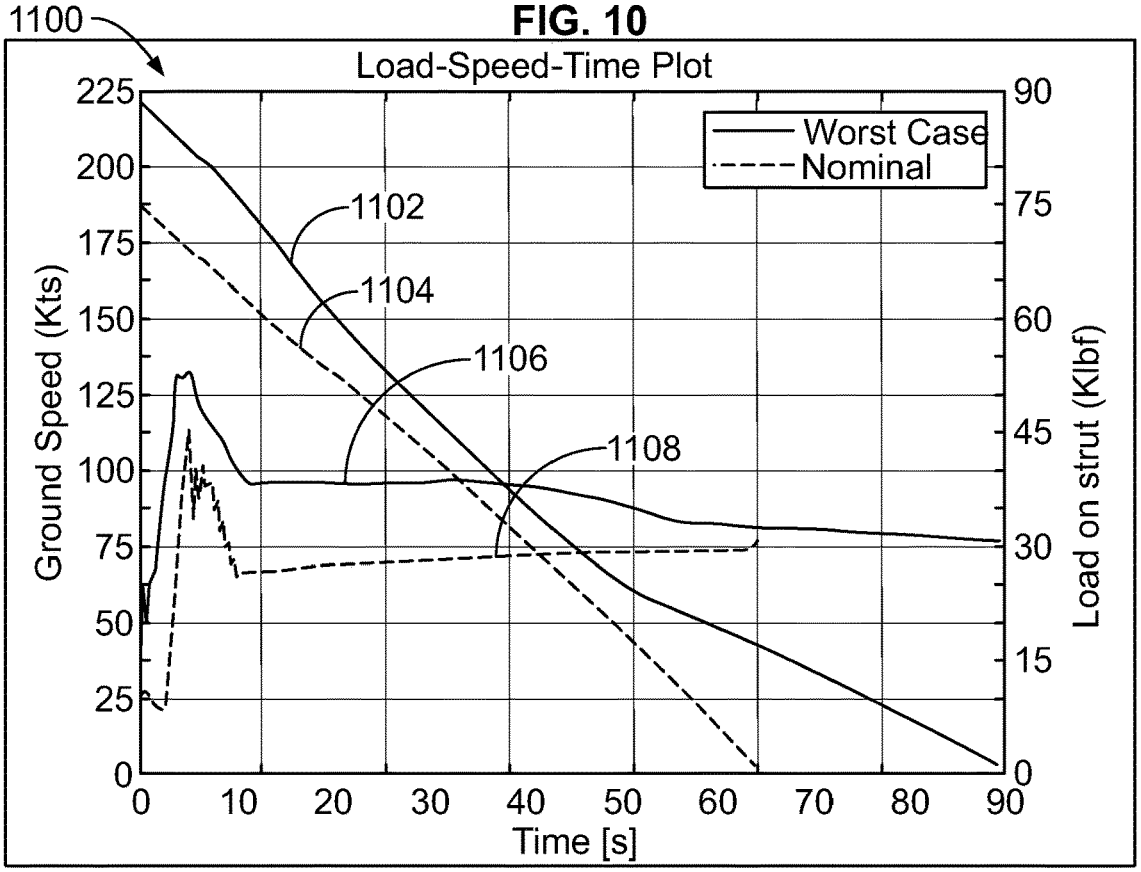
FIG. 11 illustrates a graph of simulation results showing loads on a strut of a main landing gear with updating a trailing-edge-up limit of a pitch control surface based on the load on the strut, in accordance with an example implementation.

FIG. 11 illustrates a graph 1100 of simulation results showing loads on the strut 400 of the main landing gear 204 with updating the trailing-edge-up limit of the pitch control surface 301 based on the load on the strut 400, in accordance with an example implementation. In other words, the simulation results in FIG. 11 can be obtain, for example, by setting the enable load relief signal 910 to 1 to enable the switch block 900 to pass through the updated trailing-edge-up limit from the load alleviation control module 310 when the pitch angle of the vehicle 100 is below the pitch angle threshold 914.

Axes of the graph 1100 are similar to those of the graph 1000 and depict the same parameters with the same units. Line 1102 represents variation in ground speed over time under a worst case scenario of operating conditions of the vehicle 100, line 1104 represents variation in ground speed over time under nominal operating conditions, line 1106 represents variation in the load on the strut 400 over time under a worst case scenario of operating conditions of the vehicle 100, and line 1108 represents variation in the load over time under nominal operating conditions.

Similar to the simulation results in FIG. 10, the graph 1100 shows that after the vehicle 100 lands at about time equal zero seconds, a spike in the load on the strut 400 occurs. Notably, however, the loads reached in the graph 1100 are substantially lower than the loads reached in the graph 1000.

Particularly, under worst case scenario, the line 1106 shows the force reaching about 55 klbs as opposed to 80 klbs, which is more than 31 percent reduction. Under nominal conditions, the line 1108 shows the force reaching about 45 klbs as opposed to 62 klbs, which is more than 27 percent reduction. Thus, the aerodynamic forces due to the trailing-edge-up movement of the pitch control surface 301 are decreased relative to the graph 1000 because the trailing-edge-up movement is limited by the load alleviation control module 310.

The line 1102 and the line 1104 show that the ground speed of the vehicle 100 upon landing is similar to the ground speed shown by the line 1002 and line the 1004 of the graph 1000. However, time to stopping has decreased. Particularly, the vehicle 100 stops in about 70 seconds under worst case scenario as opposed to 85 seconds, and in about 50 seconds under nominal conditions as opposed to 53 seconds. As such, both the magnitude of the load on the strut 400 and the stopping time of the vehicle 100 can be improved when using the load alleviation control strategy described above.

Figure 12:
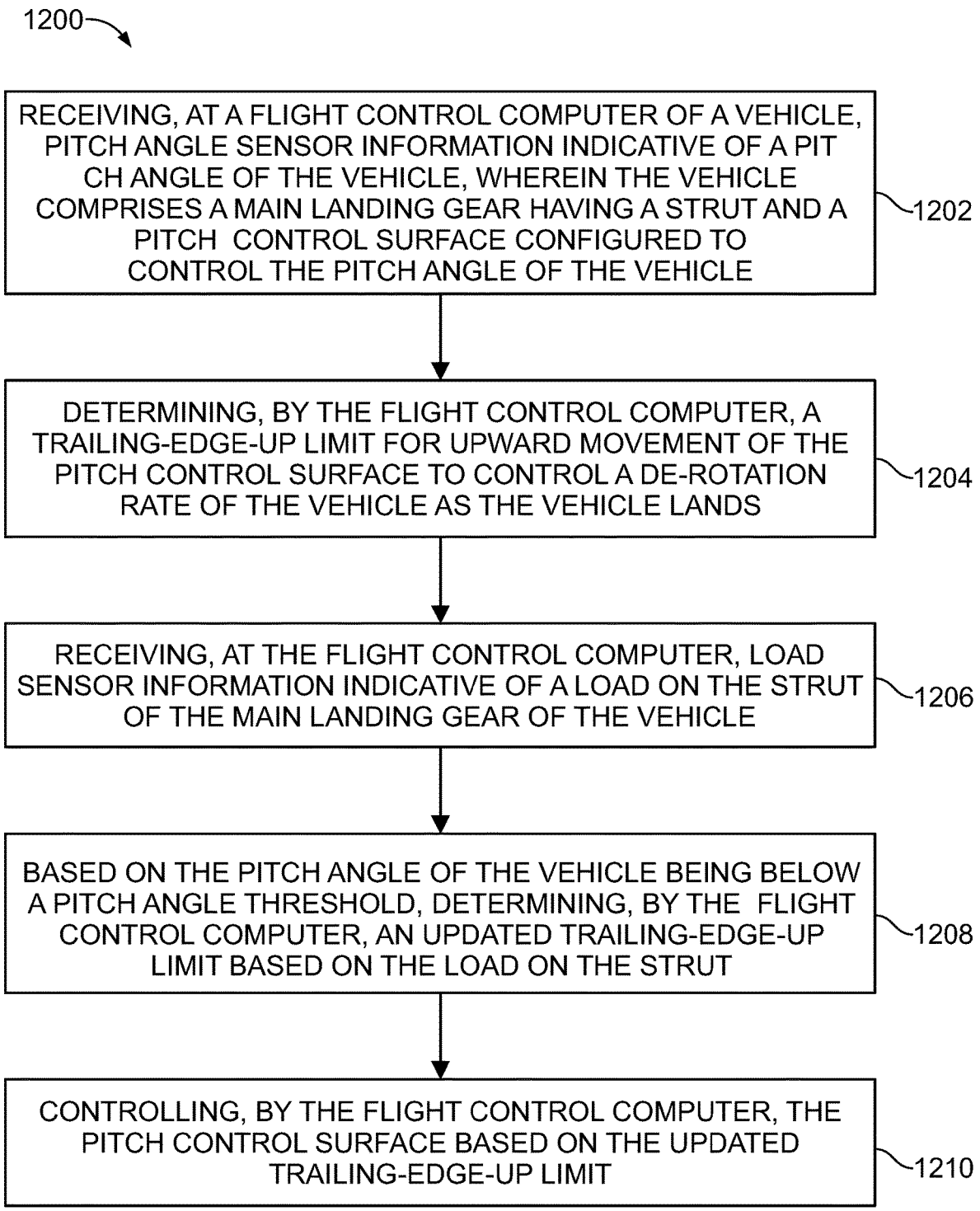
FIG. 12 is a flowchart of a method for controlling a pitch control surface of a vehicle, in accordance with an example implementation.

FIG. 12 is a flowchart of a method 1200 for controlling a pitch control surface of the vehicle 100, in accordance with an example implementation. The method 1200 can, for example, be performed by the flight control computer 304 to control the pitch control surface 301. In another example, other computing devices could be used to implement the method 1200 in collaboration with the flight control computer 304. The computing devices can be airborne and coupled to the vehicle 100 or can be ground-based. The method 1200 can, for example, be associated with performing or implementing the operations of the pitch control system 300. Further, FIGS. 13-19 are flowcharts of methods for use with the method 1200.

The method 1200 may include one or more operations, or actions as illustrated by one or more of blocks 1202-1210, 1300-1302, 1400-1404, 1500-1502, 1600-1606, 1700, 1800-1802, and 1900. Although the blocks are illustrated in a sequential order, these blocks may in some instances be performed in parallel, and/or in a different order than those described herein. Also, the various blocks may be combined into fewer blocks, divided into additional blocks, and/or removed based upon the desired implementation.

In addition, for the method 1200 and other processes and operations disclosed herein, the flowchart shows operation of one possible implementation of present examples. In this regard, each block may represent a module, a segment, or a portion of program code, which includes one or more instructions executable by a processor (e.g., a processor or microprocessor of the flight control computer 304) or a controller for implementing specific logical operations or steps in the process. The program code may be stored on any type of computer readable medium or memory, for example, such as a storage device including a disk or hard drive. The computer readable medium may include a non-transitory computer readable medium or memory, for example, such as computer-readable media that stores data for short periods of time like register memory, processor cache and Random Access Memory (RAM). The computer readable medium may also include non-transitory media or memory, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, a tangible storage device, or other article of manufacture, for example. In addition, for the method 1200 and other processes and operations disclosed herein, one or more blocks in FIGS. 12-19 may represent circuitry or digital logic that is arranged to perform the specific logical operations in the process.

At block 1202, the method 1200 includes receiving, at the flight control computer 304 of the vehicle 100, pitch angle sensor information indicative of a pitch angle of the vehicle 100, wherein the vehicle 100 comprises the main landing gear 204 having the strut 400 and the pitch control surface 301 configured to control the pitch angle of the vehicle 100.

At block 1204, the method 1200 includes determining, by the flight control computer 304, a trailing-edge-up limit for upward movement of the pitch control surface 301 to control a de-rotation rate of the vehicle 100 as the vehicle 100 lands.

At block 1206, the method 1200 includes receiving, at the flight control computer 304, load sensor information indicative of a load on the strut 400 of the main landing gear 204 of the vehicle 100.

At block 1208, the method 1200 includes, based on the pitch angle of the vehicle 100 being below a pitch angle threshold, determining, by the flight control computer 304, an updated trailing-edge-up limit based on the load on the strut 400.

At block 1210, the method 1200 includes controlling, by the flight control computer 304, the pitch control surface 301 based on the updated trailing-edge-up limit.

Figure 13:
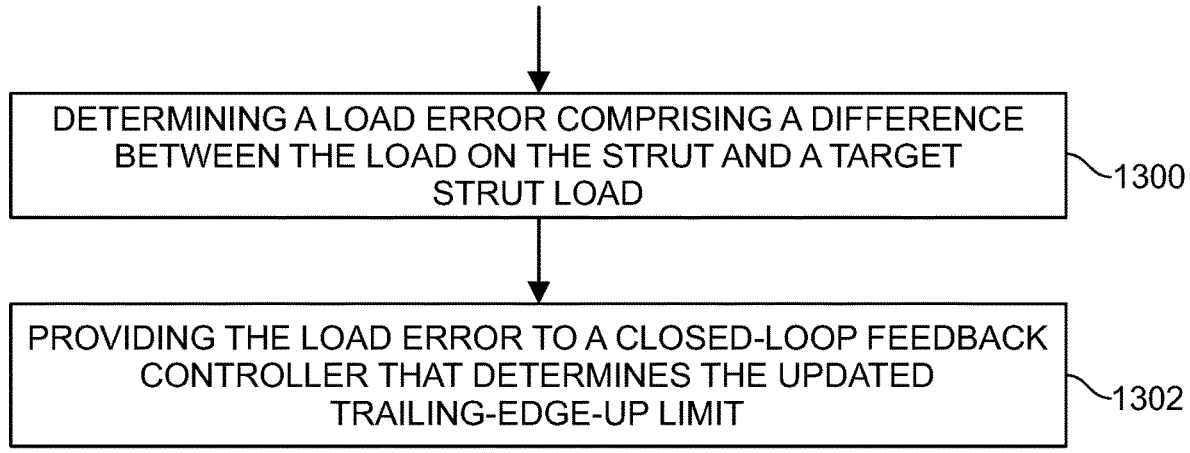
FIG. 13 is a flowchart of additional operations that may be executed and performed with the method of FIG. 12, in accordance with an example implementation.

FIG. 13 is a flowchart of additional operations that may be executed and performed with the method 1200, in accordance with an example implementation. At block 1300, operations include determining a load error comprising a difference between the load on the strut 400 and the target strut load 705. At block 1302, operations include providing the load error to a closed-loop feedback controller that determines the updated trailing-edge-up limit.

Figure 14:
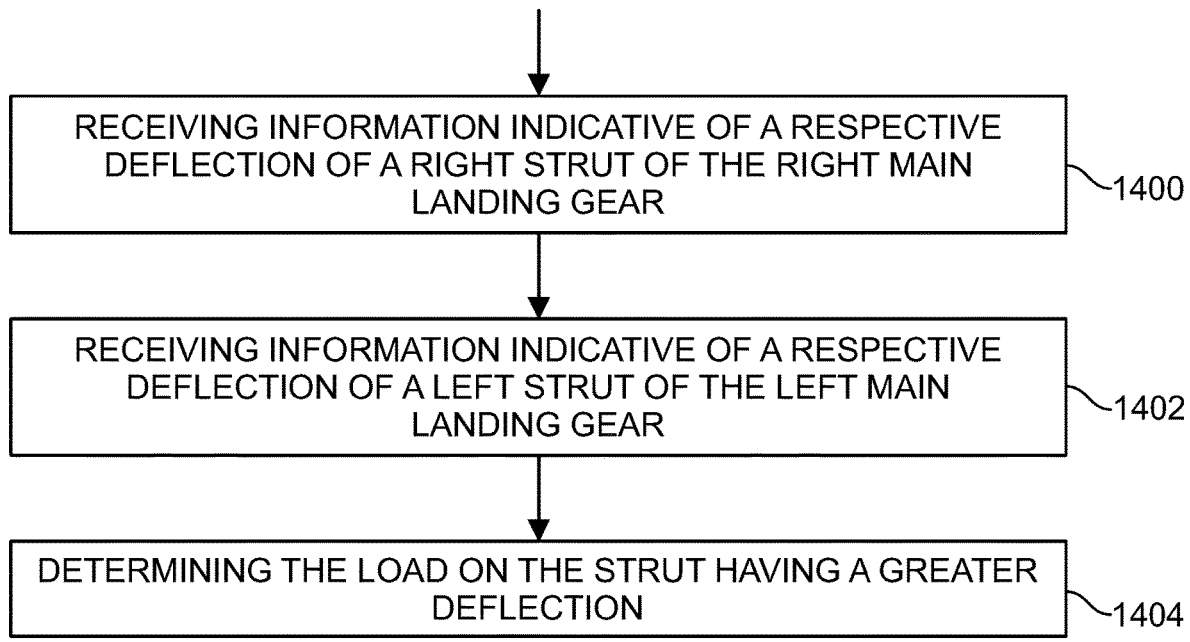
FIG. 14 is a flowchart of additional operations that may be executed and performed with the method of FIG. 12, in accordance with an example implementation.

FIG. 14 is a flowchart of additional operations that may be executed and performed with the method 1200, in accordance with an example implementation. As mentioned above, the vehicle 100 can have the main landing gear 204 (e.g., a right main landing gear) and can further include a left main landing gear. At block 1400, operations include receiving information indicative of a respective deflection of a right strut of the right main landing gear. At block 1402, operations include receiving information indicative of a respective deflection of a left strut of the left main landing gear. At block 1404, operations include determining the load on the strut having a greater deflection.

Figure 15:
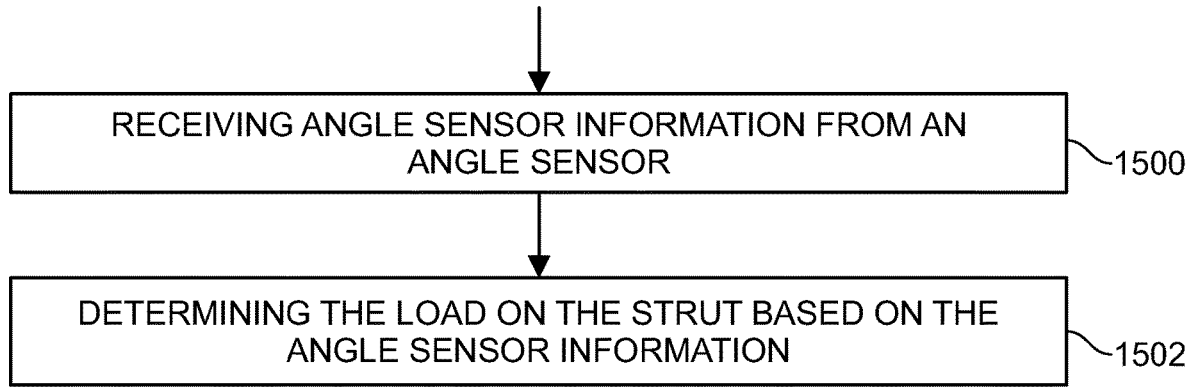
FIG. 15 is a flowchart of additional operations that may be executed and performed with the method of FIG. 12, in accordance with an example implementation.

FIG. 15 is a flowchart of additional operations that may be executed and performed with the method 1200, in accordance with an example implementation. As described with respect to FIG. 4, the main landing gear 204 includes the torque linkage 404 coupled to the strut 400 and having the first link 406 rotatably coupled to the second link 408 at the joint 410, wherein relative rotation between the first link 406 and the second link 408 about the joint 410 correlates with deflection of the strut 400 after landing of the vehicle 100, wherein the main landing gear 204 further comprises an angle sensor at the joint 410. At block 1500, operations include receiving angle sensor information from the angle sensor. At block 1502, operations include determining the load on the strut based on the angle sensor information.

Figure 16:
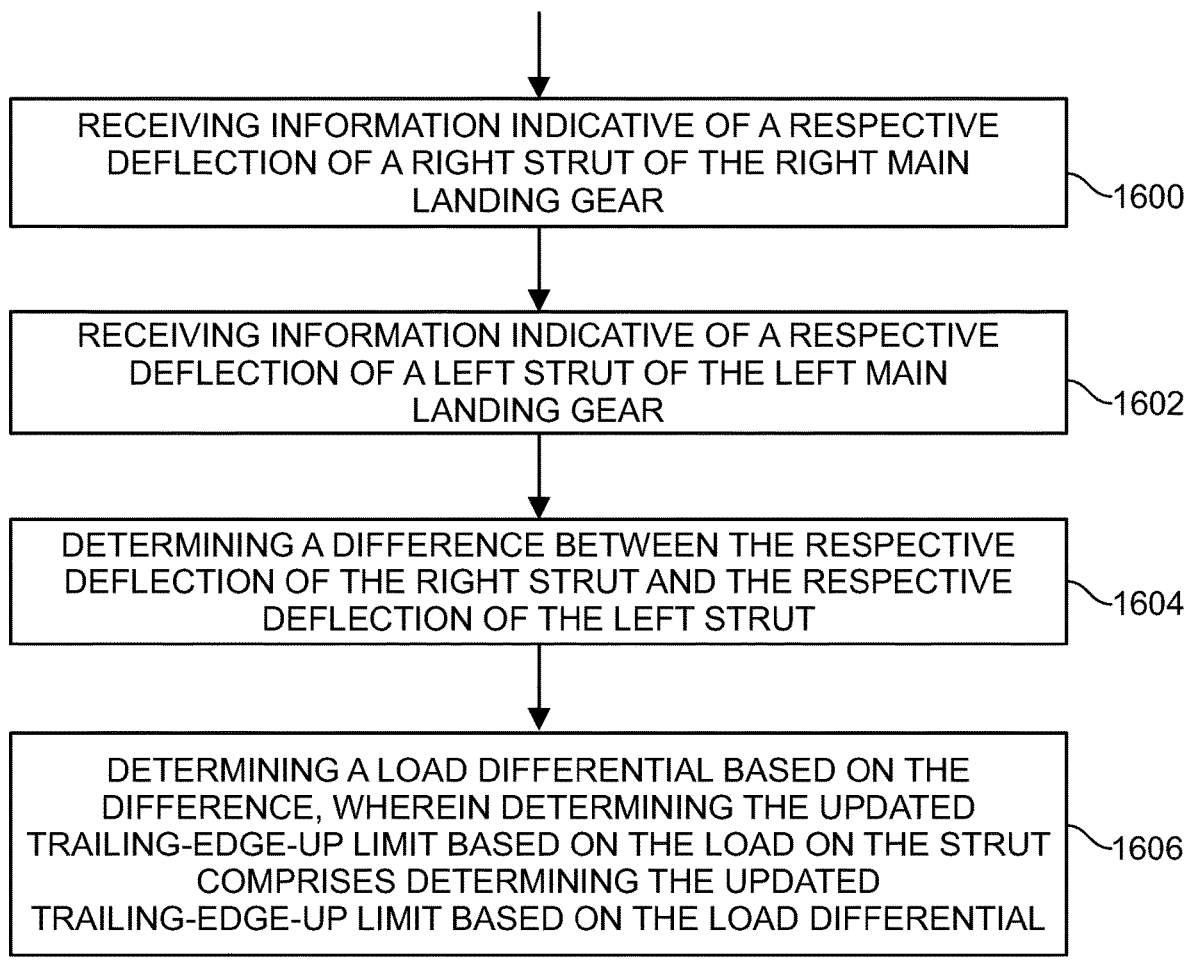
FIG. 16 is a flowchart of additional operations that may be executed and performed with the method of FIG. 12, in accordance with an example implementation.

FIG. 16 is a flowchart of additional operations that may be executed and performed with the method 1200, in accordance with an example implementation. At block 1600, operations include receiving information indicative of a deflection of a right strut of the right main landing gear. At block 1602, operations include receiving information indicative of a respective deflection of a left strut of the left main landing gear. At block 1604, operations include determining a difference between the respective deflection of the right strut and the respective deflection of the left strut. At block 1606, operations include determining a load differential based on the difference, wherein determining the updated trailing-edge-up limit based on the load on the strut comprises determining the updated trailing-edge-up limit based on the load differential.

Figure 17:
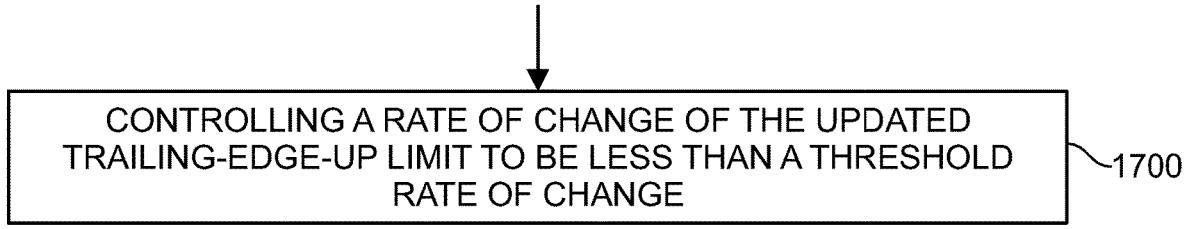
FIG. 17 is a flowchart of additional operations that may be executed and performed with the method of FIG. 12, in accordance with an example implementation.

FIG. 17 is a flowchart of additional operations that may be executed and performed with the method 1200, in accordance with an example implementation. At block 1700, operations include controlling a rate of change of the updated trailing-edge-up limit to be less than a threshold rate of change.

Figure 18:
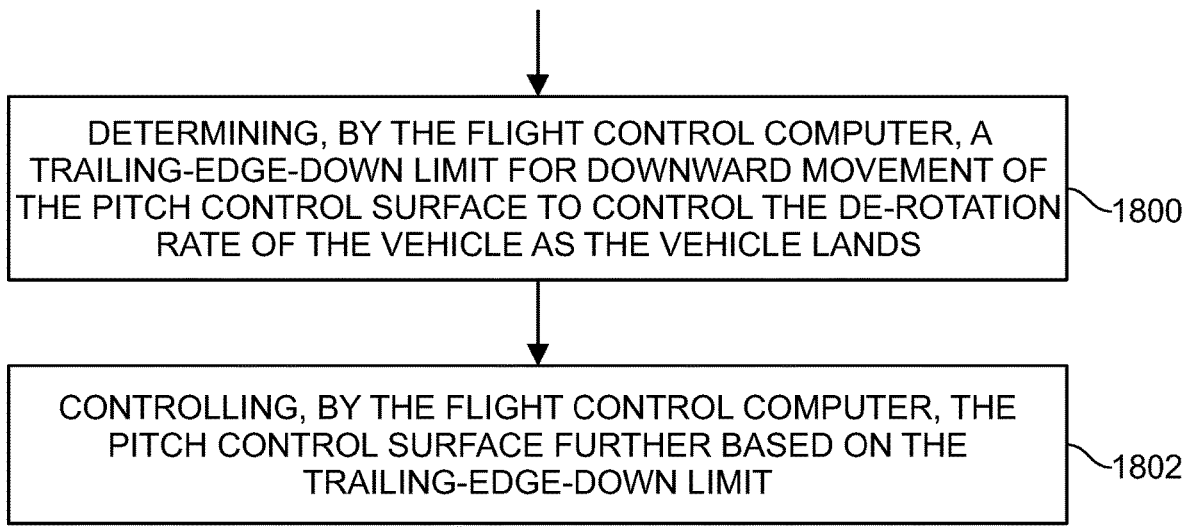
FIG. 18 is a flowchart of additional operations that may be executed and performed with the method of FIG. 12, in accordance with an example implementation.

FIG. 18 is a flowchart of additional operations that may be executed and performed with the method 1200, in accordance with an example implementation. At block 1800, operations include determining, by the flight control computer 304, a trailing-edge-down limit for downward movement of the pitch control surface 301 to control the de-rotation rate of the vehicle 100 as the vehicle 100 lands. At block 1802, operations include controlling, by the flight control computer 304, the pitch control surface 301 further based on the trailing-edge-down limit.

Figure 19:
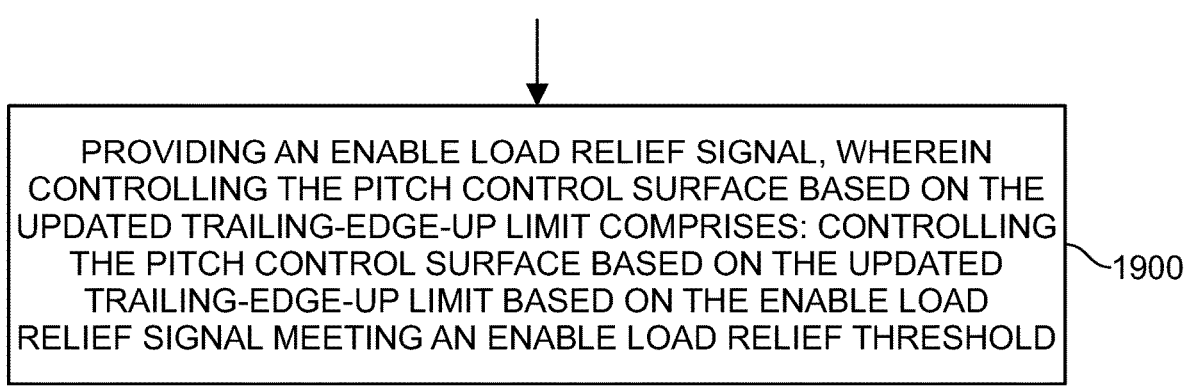
FIG. 19 is a flowchart of additional operations that may be executed and performed with the method of FIG. 12, in accordance with an example implementation.

FIG. 19 is a flowchart of additional operations that may be executed and performed with the method 1200, in accordance with an example implementation. At block 1900, operations include providing the enable load relief signal 910, wherein controlling the pitch control surface 301 based on the updated trailing-edge-up limit comprises: controlling the pitch control surface 301 based on the updated trailing-edge-up limit based on the enable load relief signal 910 meeting an enable load relief threshold.

Figure 20:
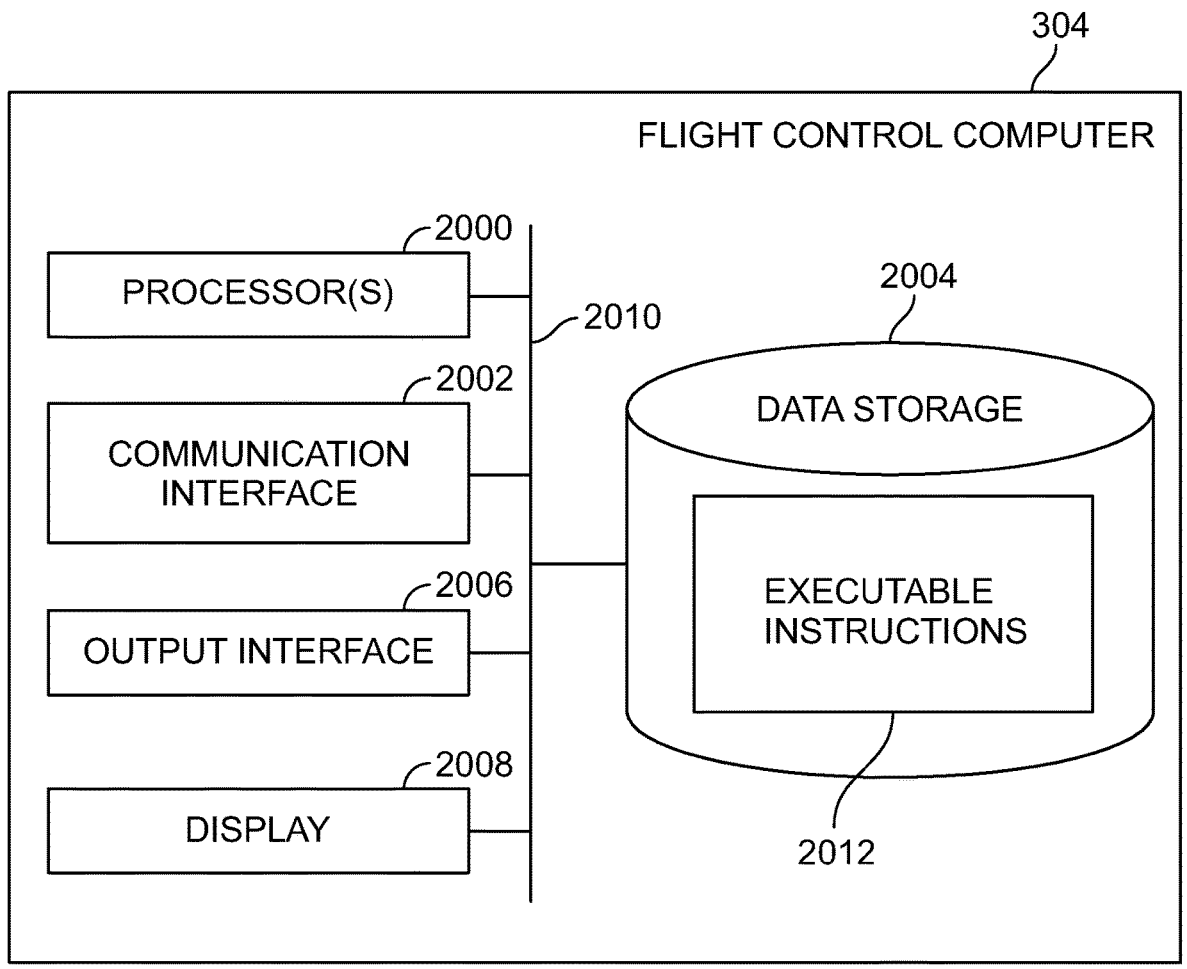
FIG. 20 is a block diagram of an example flight control computer of a vehicle, according to an example implementation.

FIG. 20 is a block diagram of the flight control computer 304, according to an example implementation. The flight control computer 304 can be used, for example, to perform operations of the flowcharts shown in FIGS. 12-19 and the pitch control system 300, as described herein. The flight control computer 304 may have processor(s) 2000, and also a communication interface 2002, data storage 2004, an output interface 2006, and a display 2008 each connected to a communication bus 2010. The flight control computer 304 may also include hardware to enable communication within the flight control computer 304 and between the flight control computer 304 and other devices or modules (not shown). The hardware may include transmitters, receivers, and antennas, for example The communication interface 2002 may be a wireless interface and/or one or more wireline interfaces that allow for both short-range communication and long-range communication to one or more networks or to one or more remote devices. Such wireless interfaces may provide for communication under one or more wireless communication protocols, Bluetooth, WiFi (e.g., an institute of electrical and electronic engineers (IEEE) 802.11 protocol), Long-Term Evolution (LTE), cellular communications, near-field communication (NFC), and/or other wireless communication protocols. Such wireline interfaces may include an Ethernet interface, a Universal Serial Bus (USB) interface, or similar interface to communicate via a wire, a twisted pair of wires, a coaxial cable, an optical link, a fiber-optic link, or other physical connection to a wireline network. Thus, the communication interface 2002 may be configured to receive input data from one or more devices, sensors (e.g., the sensors 302), or modules, and may also be configured to send output data to other devices or modules (e.g., guidance module, navigation module, trajectory management module, engine control module, etc. of the vehicle 100).

The data storage 2004 may include or take the form of one or more computer-readable storage media that can be read or accessed by the processor(s) 2000. The computer-readable storage media can include volatile and/or non-volatile storage components, such as optical, magnetic, organic or other memory or disc storage, which can be integrated in whole or in part with the processor(s) 2000. The data storage 2004 is considered non-transitory computer readable media. In some examples, the data storage 2004 can be implemented using a single physical device (e.g., one optical, magnetic, organic or other memory or disc storage unit), while in other examples, the data storage 2004 can be implemented using two or more physical devices.

The data storage 2004 thus is a non-transitory computer readable storage medium, and executable instructions 2012 are stored thereon. The executable instructions 2012 include computer executable code. When the executable instructions 2012 are executed by the processor(s) 2000, the processor(s) 2000 are caused to perform operations of the flight control computer 304 associated with the flowcharts shown in FIGS. 12-19 and the pitch control system 300.

The processor(s) 2000 may be a general-purpose processor or a special purpose processor (e.g., digital signal processors, application specific integrated circuits, etc.). The processor(s) 2000 may receive inputs from the communication interface 2002, and process the inputs to generate outputs that are stored in the data storage 2004 and output to the display 2008 (e.g., a cockpit display). The processor(s) 2000 can be configured to execute the executable instructions 2012 (e.g., computer-readable program instructions) that are stored in the data storage 2004 and are executable to provide the functionality of the flight control computer 304 described herein.

The output interface 2006 outputs information to the display 2008 or to other components as well. Thus, the output interface 2006 may be similar to the communication interface 2002 and can be a wireless interface (e.g., transmitter) or a wired interface as well The detailed description above describes various features and operations of the disclosed systems with reference to the accompanying figures. The illustrative implementations described herein are not meant to be limiting. Certain aspects of the disclosed systems can be arranged and combined in a wide variety of different configurations, all of which are contemplated herein.

Further, unless context suggests otherwise, the features illustrated in each of the figures may be used in combination with one another. Thus, the figures should be generally viewed as component aspects of one or more overall implementations, with the understanding that not all illustrated features are necessary for each implementation.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

Further, devices or systems may be used or configured to perform functions presented in the figures. In some instances, components of the devices and/or systems may be configured to perform the functions such that the components are actually configured and structured (with hardware and/or software) to enable such performance. In other examples, components of the devices and/or systems may be arranged to be adapted to, capable of, or suited for performing the functions, such as when operated in a specific manner.

By the term "substantially" it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

The arrangements described herein are for purposes of example only. As such, those skilled in the art will appreciate that other arrangements and other elements (e.g., machines, interfaces, operations, orders, and groupings of operations, etc.) can be used instead, and some elements may be omitted altogether according to the desired results. Further, many of the elements that are described are functional entities that may be implemented as discrete or distributed components or in conjunction with other components, in any suitable combination and location.

While various aspects and implementations have been disclosed herein, other aspects and implementations will be apparent to those skilled in the art. The various aspects and implementations disclosed herein are for purposes of illustration and are not intended to be limiting, with the true scope being indicated by the following claims, along with the full scope of equivalents to which such claims are entitled. Also, the terminology used herein is for the purpose of describing particular implementations only, and is not intended to be limiting.

What is claimed is:

1. A method comprising:
receiving, at a flight control computer of a vehicle, pitch angle sensor information indicative of a pitch angle of the vehicle, wherein the vehicle comprises a main landing gear having a strut and a pitch control surface configured to control the pitch angle of the vehicle;
determining, by the flight control computer, a trailing-edge-up limit for upward movement of the pitch control surface to control a de-rotation rate of the vehicle as the vehicle lands;
receiving, at the flight control computer, load sensor information indicative of a load on the strut of the main landing gear of the vehicle;
based on the pitch angle of the vehicle being below a pitch angle threshold, determining, by the flight control computer, an updated trailing-edge-up limit based on the load on the strut; and
controlling, by the flight control computer, the pitch control surface based on the updated trailing-edge-up limit.

2. The method of claim 1, wherein determining the updated trailing-edge-up limit based on the load on the strut comprises:
   determining a load error comprising a difference between the load on the strut and a target strut load; and
   providing the load error to a closed-loop feedback controller that determines the updated trailing-edge-up limit.

3. The method of claim 1, wherein the main landing gear is a right main landing gear, wherein the vehicle further comprises a left main landing gear, wherein receiving the load sensor information indicative of the load on the strut comprises:
   receiving information indicative of a respective deflection of a right strut of the right main landing gear;
   receiving information indicative of a respective deflection of a left strut of the left main landing gear; and
   determining the load on the strut having a greater deflection.

4. The method of claim 1, wherein the main landing gear comprises a torque linkage coupled to the strut and having a first link rotatably coupled to a second link at a joint, wherein relative rotation between the first link and the second link about the joint correlates with deflection of the strut after landing of the vehicle, wherein the main landing gear further comprises an angle sensor at the joint, and wherein receiving the load sensor information indicative of the load on the strut comprises:
   receiving angle sensor information from the angle sensor; and
   determining the load on the strut based on the angle sensor information.

5. The method of claim 1, wherein the main landing gear is a right main landing gear, wherein the vehicle further comprises a left main landing gear, wherein receiving the load sensor information indicative of the load on the strut comprises:
   receiving information indicative of a respective deflection of a right strut of the right main landing gear;
   receiving information indicative of a respective deflection of a left strut of the left main landing gear;
   determining a difference between the respective deflection of the right strut and the respective deflection of the left strut; and
   determining a load differential based on the difference, wherein determining the updated trailing-edge-up limit based on the load on the strut comprises determining the updated trailing-edge-up limit based on the load differential.

6. The method of claim 1, further comprising:
   controlling a rate of change of the updated trailing-edge-up limit to be less than a threshold rate of change.

7. The method of claim 1, further comprising:
   determining, by the flight control computer, a trailing-edge-down limit for downward movement of the pitch control surface to control the de-rotation rate of the vehicle as the vehicle lands; and
   controlling, by the flight control computer, the pitch control surface further based on the trailing-edge-down limit.

8. The method of claim 1, further comprising:
   providing an enable load relief signal, wherein controlling the pitch control surface based on the updated trailing-edge-up limit comprises: controlling the pitch control surface based on the updated trailing-edge-up limit based on the enable load relief signal meeting an enable load relief threshold.

9. A non-transitory computer readable medium having stored therein instructions that, in response to execution by a flight control computer of a vehicle, cause the flight control computer to perform operations comprising:
   receiving pitch angle sensor information indicative of a pitch angle of the vehicle, wherein the vehicle comprises a main landing gear having a strut and a pitch control surface configured to control the pitch angle of the vehicle;
   determining a trailing-edge-up limit for upward movement of the pitch control surface to control a de-rotation rate of the vehicle as the vehicle lands;
   receiving load sensor information indicative of a load on the strut of the main landing gear of the vehicle;
   based on the pitch angle of the vehicle being below a pitch angle threshold, determining an updated trailing-edge-up limit based on the load on the strut; and
   controlling the pitch control surface based on the updated trailing-edge-up limit.

10. The non-transitory computer readable medium of claim 9, wherein determining the updated trailing-edge-up limit based on the load on the strut comprises:
    determining a load error comprising a difference between the load on the strut and a target strut load; and
    providing the load error to a closed-loop feedback controller that determines the updated trailing-edge-up limit.

11. The non-transitory computer readable medium of claim 9, wherein the main landing gear is a right main landing gear, wherein the vehicle further comprises a left main landing gear, wherein receiving the load sensor information indicative of the load on the strut comprises:
    receiving information indicative of a respective deflection of a right strut of the right main landing gear;
    receiving information indicative of a respective deflection of a left strut of the left main landing gear; and
    determining the load on the strut having a greater deflection.

12. The non-transitory computer readable medium of claim 9, wherein the main landing gear is a right main landing gear, wherein the vehicle further comprises a left main landing gear, wherein receiving the load sensor information indicative of the load on the strut comprises:
    receiving information indicative of a respective deflection of a right strut of the right main landing gear;
    receiving information indicative of a respective deflection of a left strut of the left main landing gear;
    determining a difference between the respective deflection of the right strut and the respective deflection of the left strut; and
    determining a load differential based on the difference, wherein determining the updated trailing-edge-up limit based on the load on the strut comprises determining the updated trailing-edge-up limit based on the load differential.

13. The non-transitory computer readable medium of claim 9, wherein the operations further comprise:
    controlling a rate of change of the updated trailing-edge-up limit to be less than a threshold rate of change.

14. The non-transitory computer readable medium of claim 9, wherein the operations further comprise:
    determining a trailing-edge-down limit for downward movement of the pitch control surface to control the de-rotation rate of the vehicle as the vehicle lands; and
    controlling the pitch control surface further based on the trailing-edge-down limit.

15. The non-transitory computer readable medium of claim 9, wherein the operations further comprise:
   providing an enable load relief signal, wherein controlling the pitch control surface based on the updated trailing-edge-up limit comprises: controlling the pitch control surface based on the updated trailing-edge-up limit based on the enable load relief signal meeting an enable load relief threshold.

16. A flight control computer of a vehicle, the flight control computer comprising:
   one or more processors; and
   data storage storing thereon instructions, that when executed by the one or more processors, cause the flight control computer to perform operations comprising:
      receiving pitch angle sensor information indicative of a pitch angle of the vehicle, wherein the vehicle comprises a main landing gear having a strut and a pitch control surface configured to control the pitch angle of the vehicle,
      determining a trailing-edge-up limit for upward movement of the pitch control surface to control a de-rotation rate of the vehicle as the vehicle lands,
      receiving load sensor information indicative of a load on the strut of the main landing gear of the vehicle,
      based on pitch angle of the vehicle being below a pitch angle threshold, determining an updated trailing-edge-up limit based on the load on the strut, and
      controlling the pitch control surface based on the updated trailing-edge-up limit.

17. The flight control computer of claim 16, wherein determining the updated trailing-edge-up limit based on the load on the strut comprises:
   determining a load error comprising a difference between the load on the strut and a target strut load; and
   providing the load error to a closed-loop feedback controller that determines the updated trailing-edge-up limit.

18. The flight control computer of claim 16, wherein the main landing gear is a right main landing gear, wherein the vehicle further comprises a left main landing gear, wherein receiving the load sensor information indicative of the load on the strut comprises:
   receiving information indicative of a respective deflection of a right strut of the right main landing gear;
   receiving information indicative of a respective deflection of a left strut of the left main landing gear; and
   determining the load on the strut having a greater deflection.

19. The flight control computer of claim 16, wherein the main landing gear is a right main landing gear, wherein the vehicle further comprises a left main landing gear, wherein receiving the load sensor information indicative of the load on the strut comprises:
   receiving information indicative of a respective deflection of a right strut of the right main landing gear;
   receiving information indicative of a respective deflection of a left strut of the left main landing gear;
   determining a difference between the respective deflection of the right strut and the respective deflection of the left strut; and
   determining a load differential based on the difference, wherein determining the updated trailing-edge-up limit based on the load on the strut comprises determining the updated trailing-edge-up limit based on the load differential.

20. The flight control computer of claim 16, wherein the operations further comprise:
   determining a trailing-edge-down limit for downward movement of the pitch control surface to control the de-rotation rate of the vehicle as the vehicle lands;
   controlling the pitch control surface further based on the trailing-edge-down limit;
   providing an enable load relief signal, wherein controlling the pitch control surface based on the updated trailing-edge-up limit comprises: controlling the pitch control surface based on the updated trailing-edge-up limit based on the enable load relief signal meeting an enable load relief threshold; and
   controlling the pitch control surface based on the determining the trailing-edge-up limit to control the de-rotation rate of the vehicle based on the enable load relief signal not meeting the enable load relief threshold.

* * * * *